US008400053B2

(12) United States Patent
Ward et al.

(10) Patent No.: US 8,400,053 B2
(45) Date of Patent: Mar. 19, 2013

(54) CARBON NANOTUBE FILMS, LAYERS, FABRICS, RIBBONS, ELEMENTS AND ARTICLES

(75) Inventors: Jonathan W. Ward, Fairfax, VA (US); Thomas Rueckes, Rockport, MA (US); Brent M. Segal, Woburn, MA (US)

(73) Assignee: Nantero Inc., Woburn, MA (US)

( * ) Notice: Subject to any disclaimer, the term of this patent is extended or adjusted under 35 U.S.C. 154(b) by 745 days.

(21) Appl. No.: 12/136,624

(22) Filed: Jun. 10, 2008

(65) Prior Publication Data

US 2009/0087630 A1    Apr. 2, 2009

Related U.S. Application Data

(63) Continuation of application No. 10/341,130, filed on Jan. 13, 2003, now abandoned, which is a continuation-in-part of application No. 09/915,093, filed on Jul. 25, 2001, now Pat. No. 6,919,592, and a continuation-in-part of application No. 10/128,118, (Continued)

(51) Int. Cl.
    *H01J 63/04*    (2006.01)
(52) U.S. Cl. ...................................... 313/495
(58) Field of Classification Search .......... 313/495–497, 313/309–310
See application file for complete search history.

(56) References Cited

U.S. PATENT DOCUMENTS

| | | | |
|---|---|---|---|
| 5,764,004 A * | 6/1998 | Rabinowitz | 315/169.1 |
| 5,836,799 A * | 11/1998 | Levine et al. | 445/24 |
| 5,928,450 A * | 7/1999 | Russell | 156/169 |
| 5,993,281 A * | 11/1999 | Musket | 445/50 |
| 6,057,637 A | 5/2000 | Zettl et al. | |
| 6,110,590 A * | 8/2000 | Zarkoob et al. | 428/364 |
| 6,277,318 B1 | 8/2001 | Bower et al. | |
| 6,342,276 B1 | 1/2002 | You et al. | |
| 6,409,567 B1 | 6/2002 | Amey, Jr. et al. | |
| 6,422,450 B1 | 7/2002 | Zhou et al. | |
| 6,423,583 B1 | 7/2002 | Avouris et al. | |
| 6,495,116 B1 | 12/2002 | Herman | |
| 6,495,258 B1 | 12/2002 | Chen et al. | |
| 6,515,339 B2 * | 2/2003 | Shin et al. | 257/368 |
| 6,528,020 B1 | 3/2003 | Dai et al. | |
| 6,630,772 B1 | 10/2003 | Bower et al. | |

(Continued)

FOREIGN PATENT DOCUMENTS

| | | |
|---|---|---|
| GB | 2364933 | 2/2002 |
| JP | 2000-203821 | 7/2000 |

(Continued)

OTHER PUBLICATIONS

U.S. Appl. No. 10/341,005, filed Jan. 13, 2003, Ward.

(Continued)

*Primary Examiner* — Anh Mai
*Assistant Examiner* — Hana Featherly
(74) *Attorney, Agent, or Firm* — Nantero Inc.

(57) ABSTRACT

Carbon Nanotube Films, Layers, Fabrics, Ribbons, Elements and Articles are disclosed. To make various articles, certain embodiments provide a substrate. Preformed nanotubes are applied to a surface of the substrate to create a non-woven fabric of carbon nanotubes. Portions of the non-woven fabric are selectively removed according to a defined pattern to create the article. To make a nanofabric, a substrate is provided. Preformed nanotubes are applied to a surface of the substrate to create a non-woven fabric of carbon nanotubes wherein the non-woven fabric is substantially uniform density. The nanofabrics and articles have characteristics desirable for various electrical systems such as memory circuits and conductive traces and pads.

22 Claims, 34 Drawing Sheets

Related U.S. Application Data filed on Apr. 23, 2002, now Pat. No. 6,706,402, which is a continuation-in-part of application No. 09/915,095, filed on Jul. 25, 2001, now Pat. No. 6,574,130, and a continuation-in-part of application No. 09/915,173, filed on Jul. 25, 2001, now Pat. No. 6,643,165, and a continuation-in-part of application No. 09/915,093, filed on Jul. 25, 2001, now Pat. No. 6,919,592.

(56) References Cited

U.S. PATENT DOCUMENTS

| | | |
|---|---|---|
| 6,645,628 B2 | 11/2003 | Shiffler, Jr. et al. |
| 6,664,727 B2 * | 12/2003 | Nakamoto .................. 313/495 |
| 6,706,402 B2 | 3/2004 | Rueckes et al. |
| 6,707,098 B2 | 3/2004 | Hofmann et al. |
| 6,808,746 B1 | 10/2004 | Dai et al. |
| 6,833,558 B2 | 12/2004 | Lee et al. |
| 6,858,197 B1 | 2/2005 | Delzeit |
| 6,863,942 B2 | 3/2005 | Ren et al. |
| 6,888,773 B2 | 5/2005 | Morimoto |
| 6,890,780 B2 | 5/2005 | Lee |
| 6,894,359 B2 | 5/2005 | Bradley et al. |
| 6,899,945 B2 | 5/2005 | Smalley et al. |
| 6,905,892 B2 | 6/2005 | Esmark et al. |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,946,410 B2 | 9/2005 | French et al. |
| 7,015,500 B2 | 3/2006 | Choi et al. |
| 7,057,402 B2 | 6/2006 | Cole et al. |
| 7,161,403 B2 | 1/2007 | Bertin |
| 7,566,478 B2 | 7/2009 | Ward et al. |
| 7,781,862 B2 | 8/2010 | Bertin et al. |
| 7,835,170 B2 | 11/2010 | Bertin et al. |
| 2001/0004979 A1 | 6/2001 | Han et al. |
| 2002/0160111 A1 | 10/2002 | Sun et al. |
| 2002/0175390 A1 | 11/2002 | Goldstein et al. |
| 2003/0004058 A1 | 1/2003 | Li et al. |
| 2003/0122111 A1 | 7/2003 | Glatkowski |
| 2003/0177450 A1 | 9/2003 | Nugent |
| 2003/0200521 A1 | 10/2003 | DeHon et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0031975 A1 | 2/2004 | Kern et al. |
| 2004/0041154 A1 | 3/2004 | Watanabe et al. |
| 2004/0043527 A1 | 3/2004 | Bradley et al. |
| 2004/0071949 A1 | 4/2004 | Glatkowski et al. |
| 2004/0099438 A1 | 5/2004 | Arthur et al. |
| 2004/0104129 A1 | 6/2004 | Gu et al. |
| 2004/0132070 A1 | 7/2004 | Star et al. |
| 2004/0181630 A1 | 9/2004 | Jaiprakash et al. |
| 2004/0253167 A1 | 12/2004 | Silva et al. |
| 2004/0265550 A1 | 12/2004 | Glatkowski et al. |
| 2004/0266106 A1 | 12/2004 | Lee |
| 2005/0053525 A1 | 3/2005 | Segal et al. |
| 2005/0095938 A1 | 5/2005 | Rosenberger et al. |
| 2005/0212014 A1 | 9/2005 | Horibe et al. |
| 2006/0237537 A1 | 10/2006 | Empedocles et al. |
| 2006/0250843 A1 | 11/2006 | Bertin et al. |
| 2006/0250856 A1 | 11/2006 | Bertin et al. |
| 2006/0258122 A1 | 11/2006 | Whitefield et al. |
| 2006/0264053 A1 | 11/2006 | Yates |
| 2006/0281256 A1 | 12/2006 | Carter et al. |
| 2006/0281287 A1 | 12/2006 | Yates et al. |
| 2006/0292716 A1 | 12/2006 | Gu et al. |
| 2007/0004191 A1 | 1/2007 | Gu et al. |
| 2008/0157126 A1 | 7/2008 | Bertin et al. |
| 2008/0159042 A1 | 7/2008 | Bertin et al. |

FOREIGN PATENT DOCUMENTS

| | | |
|---|---|---|
| JP | 2001-035362 | 2/2001 |
| JP | 2004-090208 | 3/2004 |
| WO | WO-98/39250 A1 | 9/1998 |
| WO | WO-99/65821 A1 | 12/1999 |
| WO | WO 0026138 A1 * | 5/2000 |
| WO | WO-01/03208 A1 | 1/2001 |
| WO | WO-02/45113 A1 | 6/2002 |
| WO | WO-02/48701 A2 | 6/2002 |
| WO | WO-03/016901 | 2/2003 |
| WO | WO-03/034142 A1 | 4/2003 |

OTHER PUBLICATIONS

Ago, Hiroki et al. "Gas-Phase Synthesis of Single-wall Carbon Nanotubes from Colloidal Solution of Metal Nanoparticles." Journal of Physical Chemistry B (Nov. 1, 2001); vol. 105, 10453-10456.

Ajayan, P.I M.et al., "Applications of Carbon Nanotubes." Topics in Applied Physics, vol. 80, pp. 391-425, 2001.

Benerjee, Sarbajit and Stanislaus S. Wong. "Functionalization of Carbon Nanotubes with a Metal-Containing Molecular Complex." Nano Letters (2001); 0, A-E. vol. 2, No. 1, pp . 49-53.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. et al., "Monodisperse Multiwall Carbon Nanotubes Obtained with Ferritin as Catalyst," Nano Letters, 2002, vol. 2, No. 6, 665-667.

Cassell, Alan M. et al. "Large Scale CVD Synthesis of Single-Walled Carbon Nanotubes." American Chemical Society, pp. 6484-6492, 1999, vol. 103.

Chen, B., et al., "Heterogeneous Single-Walled Carbon Nanotube Catalyst Discovery and Optimization." Chem. Mater., vol. 14, pp. 1891-1896, 2002.

Cheng, H. M. et al. "Large-scale and low-cost synthesis of single-walled carbon nanotubes by the catalyst pyrolysis of hydrocarbons", Applied Physics Letters, vol. 72, pp. 3282-3284, Jun. 22, 1998.

Chiang, I.W., "Purification and Characterization of Single-Wall Carbon Nanotubes (SWNTs) Obtained from the Gas-Phase Decomposition of CO (HiPco Process)," J. Phys. Chem. B 2001, vol. 105, pp. 8297-8301.

Dai, Hongjie. "Controlled Chemical Routes to Nanotube Architectures, Physics, and Devices." The Journal of Physical Chemistry B (1999); 103: 11246-11255, vol. 103.

Delzeit, L., et al., "Multilayered Metal Catalysts for Controlling the Density of Single-walled Carbon Nanotube Growth." Chemical Physics Letters, vol. 348, pp. 368-374, 2001.

Desai et al., "Freestanding Carbon Nanotube Specific Fabrication," Proc. of 2005 5th IEEE Conf., Nanotech., Nagoya, Japan, pp. 1-4, Jul. 2005.

Franklin, N. R. et al, "An Enhanced CVD Approach to Extensive Nanotube Networks with Directionality", Advanced Materials, pp. 890-894, vol. 12, No. 12, 2000.

Haddon, R. C. "C70 Thin Film Transistors," Journal of the American Chemical Society (1996); 118, 3041-3042, vol. 118, pp. 3041-3042.

Hafner, Jason H. et al. "Catalytic growth of single-wall carbon nanotubes from metal particles," Chemical Physics Letters, vol. 296, pp. 195-202, Oct. 30, 1998.

Homma, Y., "Single-Walled Carbon Nanotube Growth on Silicon Substrates Using Nanoparticle Catalysts", Jpn. J. Appl. Phys., vol. 41, pp. L89-L91, 2002.

Kong, J. et al., "Nanotube Molecular Wires as Chemical Sensors", Science, vol. 287, pp. 622-625, Jan. 28, 2000.

Kong, Jing, "Chemical vapor deposition of methane for single-walled carbon nanotubes," Chemical Physics Letters, vol. 292, Nos. 4-6, pp. 567-574, Aug. 14, 1998.

Li, J. et al., "Carbon Nanotube Nanoelectrode Array for Ultrasensitive DNA Detection", Nano Letters, vol. 3, No. 5, pp. 597-602, 2003.

Li, Y. et al., "Preparation of Monodispersed Fe-Mo Nanoparticles as the Catalyst for CVD Synthesis of Carbon Nanotubes", Chem. Mater., vol. 12, p. 1008, 2001.

Nerushev, O. A. et al. "Carbon nanotube films obtained by thermal chemical vapor deposition", Journal of Chemistry Materials, vol. 11, pp. 1122-1132, 2001.

Onoa, G.B. et al., "Bulk production of singly dispersed carbon nanotubes with prescribed lengths," Nanotechnology, vol. 16, pp. 2799-2803, 2005.

Parikh, K. et al., "Flexible vapour sensors using single walled carbon nanotubes", Sensors and Actuators B, vol. 113, pp. 55-63, 2006.

Peigney, A. et al. "A Study of the Formation of Single- and Double-Walled Carbon Nanotubes by a CVD Method", Journal of Physical Chemistry B, vol. 105, pp. 9699-9710, 2001.

Qi, P. et al., "Toward Large Arrays of Multiplex Functionalized Carbon Nanotube Sensors for Highly Sensitive and Selective Molecular Detection", Nano Letters, vol. 3, No. 3, pp. 347-351, 2003.

Sotiropoulou, S. et al., "Carbon nanotube array-based biosensor", Anal Bioanal Chem, vol. 375, pp. 103-105, 2003.

Zhang, S. et al., "Select Pathways to Carbon Nanotube Film Growth", Advanced Materials, vol. 13, pp. 1767-1770, Dec. 3, 2001.

Zhang, Y. et al., "Formation of metal nanowires on suspended single-walled carbon nanotubes," *Appl. Phys. Lett.*, vol. 77, No. 19 p. 3015-3017, Nov. 2000.

Zhang, Y. et al., "Metal coating on suspended carbon nanotubes and its implication to metal-tube interaction", Chemical Physics Letters pp. 35-41, Nov. 24, 2000, vol. 331.

Zhao, Y. P. et al., "Frequency-dependent electrical transport in carbon nanotubes", Physical Review B, vol. 64, 201402(4), 2001.

Jeong, Tak, et al., "A new purification method of single-wall carbon nanotubes using H2S and O2 mixture gas" Chemical Physics Letters (2001) 344: 18-22, vol. 344, pp. 18-22.

Joselevich, Ernesto, et al., "Vectorial Growth of Metallic and Semi-conducting Single-Wall Carbon Nanotubes" vol. 0, No. 0, A-E.

Kahn, Michael G. C., et al., "Solubilization of Oxidized Single-Walled Carbon Nanotubes in Organic and Aqueous Solvents through Organic Derivation" (2002) 2(11) 1215-1218.

Li, Yiming, et al., "Growth of Single-Walled Carbon Nanotubes from Discrete Catalytic Nanoparticles of Various Sizes" J. Phys. Chem. B (2001) 105: 11424-11431, vol. 105, pp. 11424-11431.

Shelimov, Konstantin B., et al., "Purification of single-wall carbon nanotubes by ultrasonically assisted filtration" Chemical Physics Letters (1998) 282: 429-434, vol. 282, pp. 429-434.

International Search Report for International Patent Application No. PCT/US05/18467, Nantero, Inc., Oct. 1, 2007, 5 pages.

International Search Report for International Patent Application No. PCT/US05/18539, Nantero, Inc., Sep. 18, 2006, 4 pages.

International Search Report for International Patent Applicatoin No. PCT/US05/45316, Nantero, Inc., Sep. 6, 2006, 2 pages.

Valenti, L., et al., Sensors for Sub-ppm NO2 Gas Detection Based on Carbon Nanotube Thin Films, Applied Physics Letter, vol. 82, No. 6, Feb. 10, 2003, pp. 961-963.

Niu, C. et al., "High power electrochemical capacitors based on carbon nanotube electrodes," Appl. Phys. Lett 70 (11), Mar. 17, 1997, pp. 1480-1482.

Avouris, Phaedon et al., "Carbon Nanotube Electronics," Chemical Physics 281, 2002, pp. 429-445.

Awano, Y., "Graphene for VLSI: FET and Interconnect Applications" IEDM 2009 Technical Digest, pp. 10.1.1-10.1.4.

Brown, K.M. "System in package "The Rebirth of SIP"," 2004 IEEE Custom Integrated Circuits Conference, May 2004, 6 pages.

Collins et al., "Engineering Carbon Nanotubes and Nanotube Circuits Using Electrical Breakdown," Science, vol. 292, Apr. 2001, pp. 706-709.

Crowley, M. et al., "512 Mb PROM with 8 layers of antifuse/Diode cells," IEEE International Solid-State Circuits Conference, vol. XLVI, Feb. 2003, 24 pages.

Cui, et al., "Carbon Nanotube Memory Devices of High Charge Storage Stability," Applied Physics Letters, vol. 81, No. 17, Oct. 2002, pp. 3260-3262.

Derycke, V., et al., "Carbon Nanotube Inter- and Intramolecular Logic Gates," Nano Letters, vol. 1, No. 9, Sep. 2001, pp. 453-456.

Fuhrer, et al., "High-Mobility Nanotube Transistor Memory," Nano Letters, vol. 2, No. 7, 2002, pp. 755-759.

Hone, J., "Phonons and Thermal Properties of Carbon Nanotubes," Carbon Nanotubes, Topics Appl. Phys. 80, 2001, pp. 273-286.

Huai, Y. "Spin-Transfet Torque MRAM (STT-MTAM): Challenges and Prospects" AAPS Bulletin Dec. 2008, vol. 18, No. 6, pp. 33-40.

Jiang, Y. et al., "Performance Breakthrough in 8nm Gate-All-Around Length Gate-All-Around Nanowire Transistors using Metallic Nanowire Contacts" 2008 Symposium on VLSI Technology Digest of Technical Papers, pp. 34-35.

Johnson, R., "IBM Fellow Unrolls Blueprint for Nano," EETimes.com, Mar. 2006, 3 pages.

Kianian, S. et al., "A 3D Stackable Carbon Nanotube-based Nonvolatile Memory (NRAM)," ESSDERC, Jun. 14, 2010, Nantero, Inc., 4 pages.

Kong, et al., "Quantum Interference and Ballistic Tansmission in Nanotube Electron Waveguides," Physical Review Letters, vol. 87, No. 10, Sep. 2001, pp. 106801-1-106801-4.

Langer, et al., "Electrical Resistance of a Carbon Nanotube Bundle," J. Mater. Res., vol. 9, No. 4, Apr. 1994, pp. 927-932.

Novak, et al., "Nerve Agent Detection Using Networks of Single-Walled Carbon Nanotubes," Applied Physics Letters, vol. 83, No. 19, Nov. 2003, pp. 4026-4028.

Rueckes, et al., "Carbon Nanotube-Based Nonvolatile Random Access Memory for Molecular Computing," Science, vol. 289, Jul. 2000, pp. 94-97.

Servalli, G. "A 45nm Generation Phase Change Memory Technology," IEDM 2009 Technical Digest, pp. 5.7.1-5.7.4.

Snow, et al., "Random Networks of Carbon Nanotubes as an Electronic Material," Applied Physics Letters, vol. 82, No. 13, Mar. 2003, pp. 2145-2147.

Star, et al., "Nanoelectronic Carbon Dioxide Sensors," Adv. Mater., vol. 16, No. 22, Nov. 2004, pp. 2049-2052.

Star, et al., "Nanotube Optoelectronic Memory Devices," Nano Letters, vol. 4, No. 9, 2004, pp. 1587-1591.

Zhou, et al., "p-Channel, n-Channel Thin Film Transistors and p-n Diodes Based on Single Wall Carbon Nanotube Networks," Nano Letters, vol. 4, No. 10, 2004, pp. 2031-2035.

\* cited by examiner

Figure 1B.1

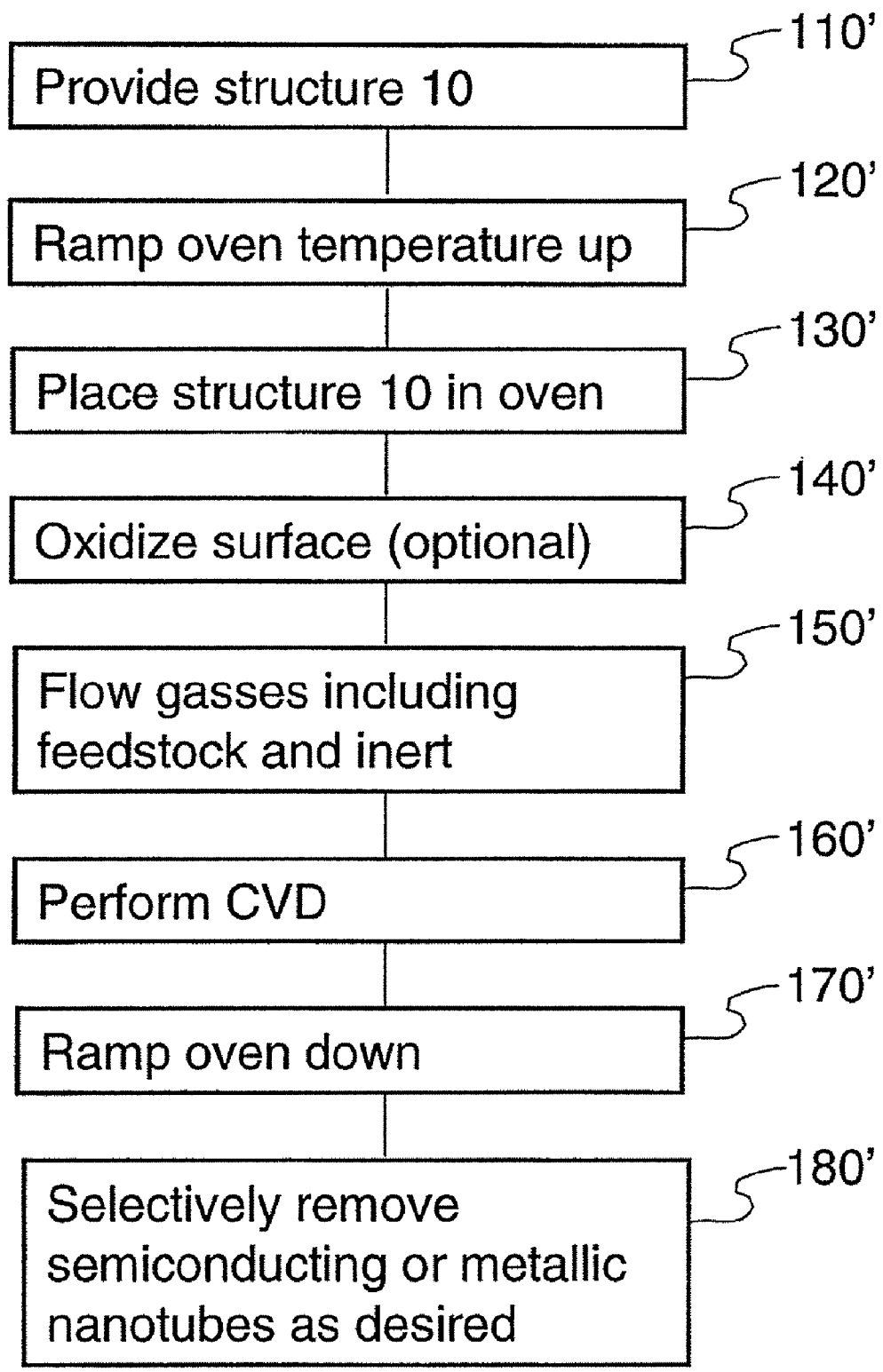
Figure 1B.2

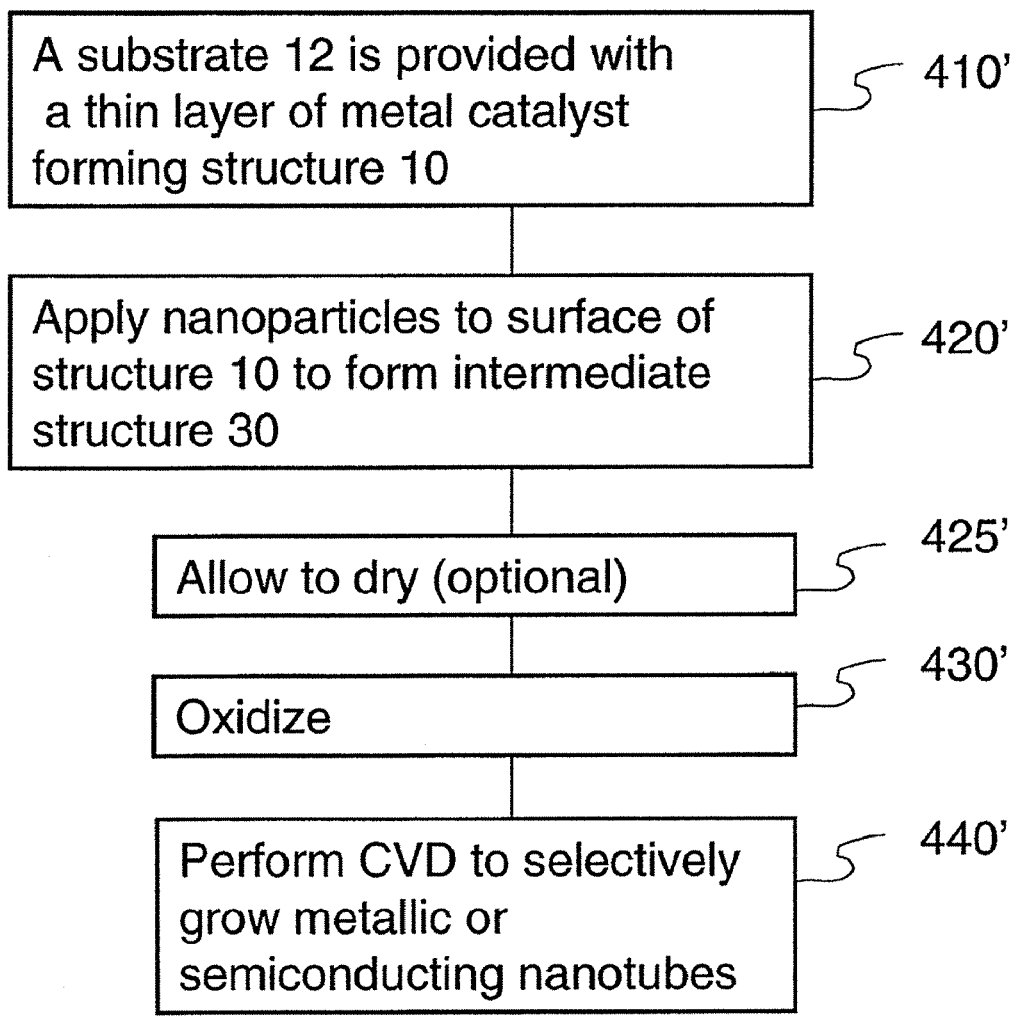

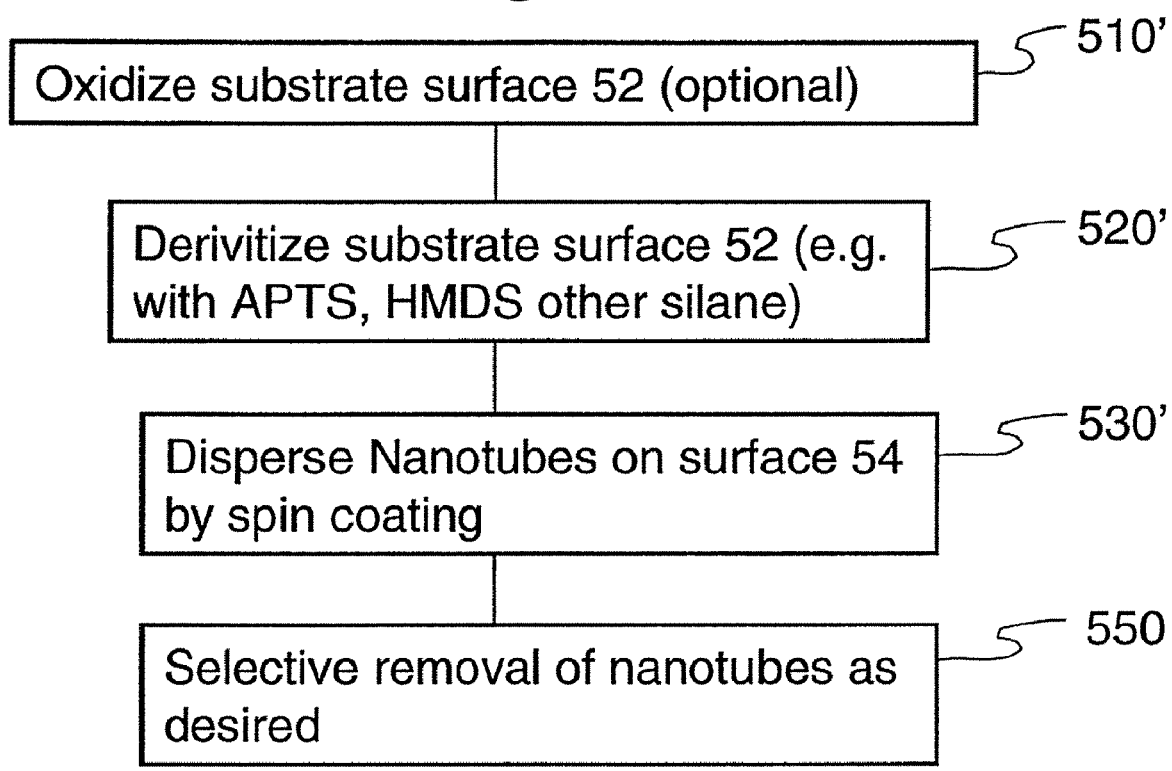

CARBON NANOTUBE FILMS, LAYERS, FABRICS, RIBBONS, ELEMENTS AND ARTICLES

CROSS-REFERENCE TO RELATED APPLICATIONS

This application is a continuation of and claims priority under 35 U.S.C. §120 to U.S. patent application Ser. No. 10/341,130, entitled "Carbon Nanotube Films, Layers, Fabrics, Ribbons, Elements and Articles," filed Jan. 13, 2003, which is a continuation-in-part of and claims priority under 35 U.S.C. §120 to U.S. patent Ser. No. 09/915,093, entitled "Electromechanical Memory Array Using Nanotube Ribbons and Method for making Same" filed Jul. 25, 2001, now U.S. Pat. No. 6,919,592, and is also a continuation-in-part of and claims priority to U.S. patent application Ser. No. 10/112,8118, entitled "Nanotube Films and Articles" filed, Apr. 23, 2002, now U.S. Pat. No. 6,706,402, which are each assigned to the assignee of this application, and all of which are incorporated by reference in their entireties.

This application is related to the following applications, all of which are assigned to the assignee of this application, and all of which are incorporated by reference in their entirety:

Methods of Making Carbon Nanotube Films, Layers, Fabrics, Ribbons, Elements and Articles (U.S. patent application Ser. No. 10/341,005), filed on Jan. 13, 2003;

Methods of Using Thin Metal Layers to Make Carbon Nanotube Films, Layers, Fabrics, Ribbons, Elements and Articles (U.S. patent application Ser. No. 10/341,055), filed on Jan. 13, 2003; and Methods of Using Pre-formed Nanotubes to Make Carbon Nanotube Films, Layers, Fabrics, Ribbons, Elements and Articles (U.S. patent application Ser. No. 10/341,054), filed on Jan. 13, 2003.

BACKGROUND

1. Technical Field

The present invention relates generally to nanotube films, layers, and fabrics and methods of making same and, more specifically to carbon nanotube films, layers, and fabrics and methods of making same so that they form or may be made to form patterned ribbons, elements and articles of various shapes and characteristics.

2. Discussion of Related Art

Wire crossbar memory (MWCM) has been proposed. (See U.S. Pat. Nos. 6,128,214; 6,159,620; and 6,198,655.) These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

More recently, memory devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul. 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown. Improved memory cell designs are thus desired.

The reliable fabrication of electrically conductive, ultra-thin metallic layers and electrodes in the sub-10 nm regime is problematic. (See e.g., S. Wolf, Silicon Processing for the VLSI era; Volume 2—Process Integration, Lattice Press, Sunset Beach, 1990.) Metal films in this size regime are usually non-continuous and not conductive over macroscopic distances. Furthermore, these sub-10 nm films are prone to thermal damage by electrical current, making them unsuitable for applications such as electrical interconnects in semiconductor devices. Thermal damage of thin metal interconnects caused by their low heat conductivities is one of the main factors inhibiting dramatic miniaturization and performance improvements of highly integrated semiconductor devices.

Conventional interconnect technologies have a tendency to suffer from thermal damage and metal diffusion eroding the performance of the semiconductor devices especially from degradation of the electrical properties. These effects become even more pronounced with size reduction in current generation 0.18 um and 0.13 um structures, e.g. by metal diffusion through ultra-thin gate oxide layers.

There is therefore a need in the art for conductive elements that may operate well in contexts having high current densities or in extreme thermal conditions. This includes circuit contexts with very small feature sizes but includes other high current density, extreme thermal environment contexts as well. There is also a need for conductive elements that will be less likely to diffuse undesirable amounts of contaminants into other circuit elements.

SUMMARY

The invention provides new carbon nanotube films, layers, fabrics, ribbons, elements and articles.

According to one aspect of the invention, a conductive article has a plurality of nanotube segments in contact to define a plurality of conductive pathways along the article and the article has a shape of pre-defined pattern.

According to another aspect of the invention, an assembly includes a substrate and a conductive trace disposed on the substrate. The trace includes nanotube segments that contact other nanotube segments to define a plurality of conductive pathways along the trace. The trace has a shape of pre-defined pattern.

According to another aspect of the invention, a conductive trace includes an electrical network of nanotubes in contact with other nanotubes to define a plurality of conductive pathways along the trace. The trace has a shape of pre-defined pattern.

According to another aspect of the invention, the nanotube segments include single walled carbon nanotubes.

According to other aspects of the invention, the article or trace is primarily a monolayer of nanotube segments.

According to other aspects of the invention, the article or trace is about 2 nm or less in thickness.

According to other aspects of the invention, the article or trace has nanotube segments that include multi-walled carbon nanotubes.

According to other aspects of the invention, the article or trace has nanotube segments that have different lengths.

According to other aspects of the invention, the article or trace has nanotube segments that include segments having a length shorter than the length of the article.

According to other aspects of the invention, the article or trace has nanotube segments that have a conformal characteristic to conform to non-planar surfaces.

According to other aspects of the invention, the article or trace has a resistance of about 1-1000 k$\Omega$/□.

According to other aspects of the invention, the article or trace has a substantially uniform density of nanotube segments.

According to other aspects of the invention, a non-woven fabric of carbon nanotubes are in contact and the fabric has substantially uniform density.

According to other aspects of the invention, the non-woven fabric has a controlled composition of metallic nanotubes relative to semiconducting nanotubes.

According to other aspects of the invention, the non-woven fabric is primarily single-walled carbon nanotubes.

According to other aspects of the invention, the non-woven fabric is primarily multi-walled carbon nanotubes.

According to other aspects of the invention, the non-woven fabric is primarily a monolayer of nanotube segments.

According to other aspects of the invention, the non-woven fabric is primarily a multilayer of nanotube segments.

According to other aspects of the invention, the non-woven fabric is about 2 nm or less in thickness.

According to other aspects of the invention, the non-woven fabric has a conformal characteristic to conform to non-planar surfaces.

According to other aspects of the invention, the non-woven fabric has a resistance of about 1-1000 k$\Omega$/□.

BRIEF DESCRIPTION OF THE DRAWINGS

In the Drawing,

FIGS. 4B-D illustrate exemplary methods of growing nanotube fabric by CVD using the structure of FIG. 4A.

FIGS. 5I-J illustrate exemplary methods of forming nanotube fabric by spin-coating preformed nanotubes in suspension.

DETAILED DESCRIPTION

Figure 1A:
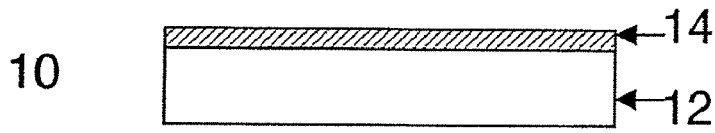
FIG. 1A shows a structure, according to certain embodiments of the invention, having a thin layer of metal catalyst that may be used in an exemplary method of growing nanofabric.
Figure 1A:
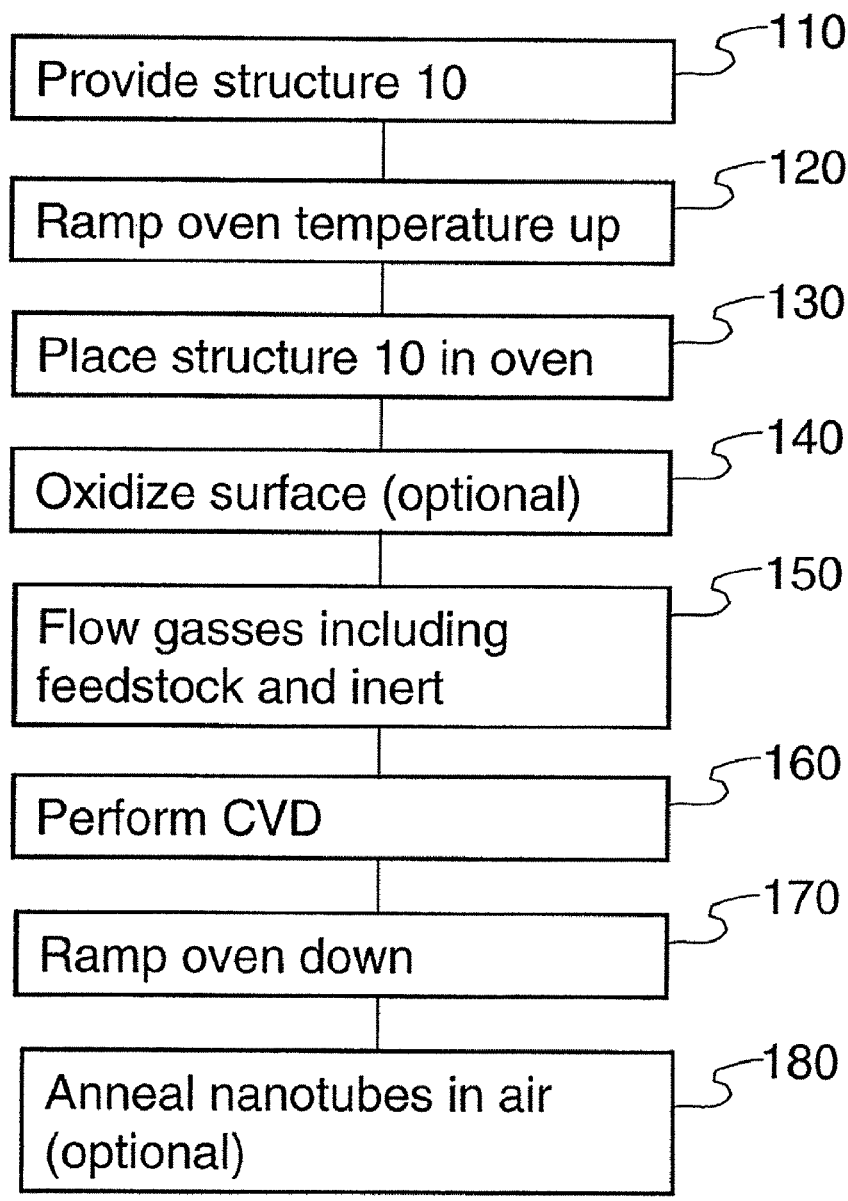

Preferred embodiments of the invention provide nanotube films, layers, or non-woven fabrics and methods of making same so that they form, or may be made to form, various useful patterned components, elements or articles. (Hereinafter "films," "layers," or "non-woven fabrics" are referred to as "fabrics" or "nanofabrics".) The components created from the nanofabrics retain desirable physical properties of the nanotubes and/or the nanofabrics from which they are formed. In addition, preferred embodiments allow modern manufacturing techniques (e.g., those used in semiconductor manufacture) to be readily employed to utilize the nanofabric articles and devices.

For example, the nanofabrics may be patterned into ribbons, which can be used to create non-volatile electromechanical memory cells. As explained in U.S. patent application Ser. Nos. 09/915,093 and 10/033,323 (incorporated by reference in their entireties), the ribbons may be used as a component of a non-volatile electromechanical memory cell. The deflected, physical state of the ribbon may be made to represent a corresponding information state. The deflected, physical state has non-volatile properties, meaning the ribbon retains its physical (and therefore informational) state even if power to the memory cell is removed. The nanofabric may also be formed into conductive traces or pads. As explained in U.S. patent application Ser. Nos. 10/128,118 and 10/175,586 (incorporated by reference in their entireties), the trace has advantageous electrical and thermal conductivity, allowing it to be used for extremely small feature sizes, or to be utilized as a transistor component, such as a gate or base of a transistor forming superior metal to semiconductor contacts. The nanofabrics may also be formed or patterned into shorter segments such as ribbons or patches. The shorter segments or patches allow facile interconnection of their nanotubes to vias, interconnects, traces or other structures useful in electronic devices. They may also be used to create new forms of electromechanical memory cells, for example, non-crossbar, embedded cells. The articles so formed help enable the generation of nanoelectronic devices and may also be used to assist in increasing the efficiency and performance of current electronic devices using a hybrid approach (e.g., using nanoribbon memory cells in conjunction with semiconductor addressing and processing circuitry).

Preferred nanofabrics have a plurality of nanotubes in contact so as to form a non-woven fabric. Gaps in the fabric, i.e., between nanotubes either laterally or vertically, may exist. The fabric preferably has a sufficient amount of nanotubes in contact so that at least one electrically conductive, semiconductive or mixed conductive and semi-conductive pathway exists from a given point within a ribbon or article to another point within the ribbon or article (even after patterning of the nanofabric).

Though certain embodiments prefer single-walled nanotubes in the nanofabrics, multi-walled nanotubes may also be used. In addition, certain embodiments prefer nanofabrics that are primarily a monolayer with sporadic bilayers and trilayers, but other embodiments benefit from thicker fabrics with multiple layers.

To create a nanofabric, the technique chosen must result in a sufficient quantity of nanotubes in contact with other nanotubes which thereby matte as a result of the nanotubes' adhesion characteristics. Certain embodiments (e.g., memory cells) benefit when the nanofabric is very thin (e.g., less than 2 nm); for example, when the nanofabric is primarily a monolayer of nanotubes with sporadic overlapping (sometimes fabric will have portions that are bilayers or trilayers), or a multilayer fabric with relatively small diameter nanotubes. Moreover, many of these embodiments benefit when the nanotubes are single-walled nanotubes (SWNTs). Other embodiments (e.g., conductive traces) may benefit from thicker fabrics or multi-walled nanotubes (MWNTs).

The nanotubes have a resistance per square between 1-1000 k$\Omega$/$\square$ (a lower resistance per square value is generally preferred) but can be tuned to have a resistance per square between 1 k$\Omega$/$\square$-10 M$\Omega$/$\square$ which is dependent upon the quality of nanotubes used and their electrical and mechanical characteristics. The porosity of the fabric can be tuned as well to generate low density fabrics with high porosity and high density fabrics with low porosity. The average length of a nanotube ranges between 50-1000 nm and 1-100 µm including single-walled nanotubes, multi-walled nanotubes or a mixture of both and can be controlled as is necessary for a particular application such as memory, switches, relays, chemical sensors, biosensors and resonators.

Certain preferred methods of constructing the nanofabrics involve growing nanotubes using chemical vapor deposition (CVD) processes in conjunction with various catalysts. Other preferred methods generate films using spin-coating techniques with preformed nanotubes. The fabrics may be patterned after being formed or they may be grown or formed in a predetermined pattern, e.g., by using patterned catalyst metal layers, nanoparticles or a combination thereof.

Growing Nanofabrics

Introduction

Carbon nanotubes can be grown on substrates whose surfaces contain certain metallic or oxide layers. The metallic or metal oxide layers allow metal-containing nanoparticles to be applied onto the substrate surface. Exemplary nanoparticles include metals, such as iron, cobalt, nickel, tungsten, molybdenum, rhenium and other transition metals, or metal oxides. The metals or metal oxides in these methods act as growth catalyst for carbon nanotubes.

The literature has documented research results regarding the growth of single-walled nanotubes (SWNTs) from prefabricated nanoparticles (see Kong, J., et al., Chemical Physics Letters, 292, 567, 1998; Li, Y., et al., Journal of Physical Chemistry B, 105, 11424, 2001; Dai, H., et al., Journal of Physical Chemistry B, 103, 11246, 1999; Colomer, J.-F., et al., Chemical Physics Letters, 345, 11, 2001; and Li, Y. and Liu, J., Chem. Mater., 13. 1008, 2001), catalyst solutions, e.g., "liquid catalysts" (s Cassell, A., et al., Journal of Physical Chemistry B, 103, 6484, 1999 and Cassell, A., et al., Journal Am. Chem. Soc., 121, 7975, 1999), and layered catalytic deposition (Lee Cassell, A., et al., Journal of Physical Chemistry B, 103, 6484, 1999). Metal oxides of various diameters may be used depending upon whether growth of single-walled nanotubes (SWNTs) or multi-walled nanotubes is desired. (See, e.g., Y. Li, W. Kim et al., Growth of Single-Walled Carbon Nanotubes From Discrete Catalytic Nanoparticles of Various Sizes, Journal of Physical Chem. B, 105, 11424, 22 Nov. 2001.) Bi-metallic catalyst nanoparticles (iron-molybdenum) have also been fabricated to assist in the production of carbon nanotubes (see Li, Y. and Liu, J., Chem. Mater., 13. 1008, 2001). These nanoparticles are usually dispersed randomly on a substrate or other support to produce nanotube growth. Typical liquid catalysts contain a mixture of chlorides or nitrates that have iron, cobalt, nickel, or molybdenum. These liquid catalysts are generated by soaking a pre-patterned 'stamp' onto a substrate. After stamping, the catalyst is calcinated or oxidized to burn off all the chlorides, nitrides, and other species leaving a random distribution of metal nanoparticles within a broad size regime. Yet another method of producing SWNTs involves the deposition of metal layers (se Delzeit, L., et al., Chemical Physics Letters, 348, 368, 2001). The metal layers may include a porous under-layer such as aluminum or iridium, a catalytic layer (iron, cobalt, nickel), and a co-catalyst layer, typically molybdenum. The catalyst nanoparticles required for nanotube formation are produced during the CVD process.

The inventors have discovered that the above techniques may be extended to create nanofabrics, which have important characteristics that may be controlled in the creation process. In addition, they have discovered new techniques to create nanofabrics. The fabrics can be assembled or grown (e.g., over an entire wafer surface) and then fabric may be selectively removed, e.g., by using lithographic patterning. In some embodiments, the fabric may be formed in a pattern; i.e., nanotube fabric will grow in places where desired and none need be removed subsequent to growth.

To grow nanofabrics, the metallic nanoparticles may be applied to the substrate surface in a variety of ways, including spin coating, application via aerosol, or by dipping the substrate into a solution that includes such nanoparticles. The metallic nanoparticles used as catalyst may also be applied to the substrate surface by deposition of a gas-phase metallic precursor such as any metallocene including ferrocene, molybdocene, cobaltocene and many other derivatives known in the literature to vaporize at relatively low temperatures, e.g. 25-600° C. (i.e., a low temperature relative to the temperatures at which carbon nanotube growth would occur using that metal as catalyst).

Once a catalyst has been applied to the surface, an appropriate feedstock gas is supplied to the substrate's environment using a CVD process and nanotubes are allowed to grow. Typical growth times range from under 1 minute to 60 minutes. A typical growth phase can be completed in less than ten minutes. Examples of appropriate feedstock gasses include, but are not limited to CO, $CH_4$, $C_2H_4$ and other carbon sources. The feedstock gas should be used at proper flow rates and at proper concentrations with inert gasses such as argon or nitrogen. Typical temperature regimes are about 600-1000° C.

Some factors influencing nanotube growth include catalyst composition, catalyst diameter, catalytic growth efficiency, temperature, CVD run time and choice of reagents including catalysts and feedstock gasses as well as reductants and inert carrier gasses, flow rates, ratios of gasses and mixtures and substrate type and composition.

The films generated by this method are typically characterized in bulk by resistance in ohms per square ($\Omega/\square$) measurements that range from 1 to 1000 k$\Omega/\square$ or in some circumstances from 1 to 20 M$\Omega/\square$. This measurement can be used to describe the quality and density of the tubes in bulk growth where lower resistance per square indicates a denser fabric and a relatively high concentration of metallic nanotubes.

Thin Catalyst Layers for Growth of Nanotubes

One preferred method of growing nanofabrics uses CVD techniques with substrates having a thin layer of metal catalyst on the substrate surface. The thin layers allow the catalyst to be easily removed in subsequent processing steps. Thicker catalyst layers may require more difficult processing steps.

FIG. 1A shows a cross-sectional view of an exemplary structure 10 having a substrate 12 and a thin metal catalyst layer 14 (shown here as one layer, though more than one layer may be employed). This figure is not to scale; the metal catalyst layer of typical embodiments is only about 1-2 nm thick.

An exemplary, non-limiting substrate 12 is made of silicon and has an upper layer of $SiO_2$ (not shown). The $SiO_2$ insulates the conductive nanotubes (once formed) from the underlying bulk silicon of substrate 12. Moreover, the upper layer of the substrate 12 may already have formed therein various elements that may be used together with the to-be-formed nanofabric articles to form circuits and the like, or the articles may be used as conductive connections between circuits formed on the substrate.

The metals that can be used as primary catalyst metals of layer 14 can be selected from a non-exclusive group known to produce SWNTs, such as iron, nickel, cobalt, and molybdenum. Metal layer 14 can also include metals that act in conjunction with primary catalysts as co-catalysts, such metals include, but are not limited to, aluminum, molybdenum, cobalt, or other co-catalyst metals. If multi-walled nanotubes (MWNTs) are desired, these and additional transition metals may be used in layer 14, such as yttrium, lanthanides and actinides.

The growth of nanotubes from deposited thin metal layers 14 typically involves the deposition by any physical vapor deposition technique of an aluminum layer, an iron layer, and/or a molybdenum layer, onto a substrate 12. (The aluminum layer generates a porous reactive support that aids in generation of carbon species which feed into the iron catalyst where growth of the nanotubes actually takes place. The molybdenum layer also serves as a site to reduce the carbon to a reactive form. The iron by itself can accomplish this reduction even but in some cases the rate is increased if the Mo and Al are present as well.) The thin metal layers 14 such as aluminum and molybdenum assist in the formation of SWNTs during CVD (when these three metals are used in concert, iron is the primary growth catalyst). These layers are extremely thin (e.g., 1-2 nm) and will diffuse or vaporize during CVD growth. Some of the particles created from such vaporization may be encapsulated by the eventually-grown nanotubes. (As the nanotubes are growing, the thin layers will diffuse. When layers are heated, they have a tendency to generate particles. Some of these particles will contain iron which will then be the site of the direct growth of carbon nanotubes. If in some instances the catalyst is very small, then the catalyst particle will be carried along as the nanotube grows. In other cases the catalyst particle will be larger and the nanotube will grow out from this end leaving the catalyst particle in place. Either way, if one looks at a transmission electron micrograph of a nanotube, one will almost always find at one end a nanoparticle, which acted as a catalyst.)

FIG. 1B.1 illustrates a way of forming nanofabrics utilizing a substrate with thin metal catalyst layer(s). First, an intermediate structure 10 is provided 110. The structure, as outlined above, includes a substrate 12 and a metal catalyst layer 14. A furnace is heated 120 to about 500° C. The structure 10 is placed 130 into the furnace. If desired, the metal layer 12 may be oxidized 140 in air. The oxidation can take place at 500° C. for 30 minutes. Oxidizing may be desired because it generates nanoparticles on the surface when metal atoms migrate and rearrange themselves. The temperature of the substrate 10 is ramped up to the CVD temperature and a flow of feedstock and inert gasses is provided 150. For example, hydrogen gas is mixed with an inert gas that has proper heat diffusion properties (typically argon or nitrogen). In some embodiments, the ratio of the gasses can be 1:5 hydrogen to inert gas (the ratio, however, should depend on the flow rate and types of gas introduced into the system upon reaching CVD temperature). For example, methane at a flow rate of 100-750 standard cubic centimeters per minute (sccm), or ethylene gas at 1.0-5.0 sccm may be used. The CVD run is performed 160 for some time typically between 1-10 minutes. (A CVD process or chemical vapor deposition involves in this case a carrier gas (argon), a reductant (hydrogen) and a carbon feedstock (methane, ethylene in combination or alone, or other gas)). The furnace is ramped down 170 to less than 200° C. in a flow of inert gas or gasses that have low or no reactivity with the carbon sources, such as argon or nitrogen. Depending on properties desired in the resulting nanotube fabric, the gas used could be air or oxygen at a lower temperature; such use would provide a final annealing 180 for nanotube adhesion and/or removal of amorphous carbon. As a result of the above, a nanofabric is created over substrate 12 and the thin metal layer 14 is substantially or totally vaporized.

The surface of the substrate 12 may have a defined pattern (e.g., a grating) on its surface. For example, the surface may have alternating regions of metal or semiconductor and insulator. The metal or semiconducting embedded materials may be partially or totally capped off by a sacrificial layer which can be removed later to provide a suspended nanotube nanoribbon structure. See U.S. patent application Ser. Nos. 09/915,093 and 10/033,323.

A defined thin metal layer pattern will determine the origination of nanotube growth. (That is, nanotube growth will originate from the catalyst regions rather than the interstitial regions which do not have catalyst. This characteristic may be exploited; i.e., depending on the ultimate use of the nanoribbons or nanofabric articles, a specific surface pattern may be desired (for example in a memory device). Moreover, the thin metal layer catalyst may be patterned to create a patterned growth of nanofabric. If the catalyst patterns are sufficiently far away from each other they may not require subsequent patterning.

Figure 2:
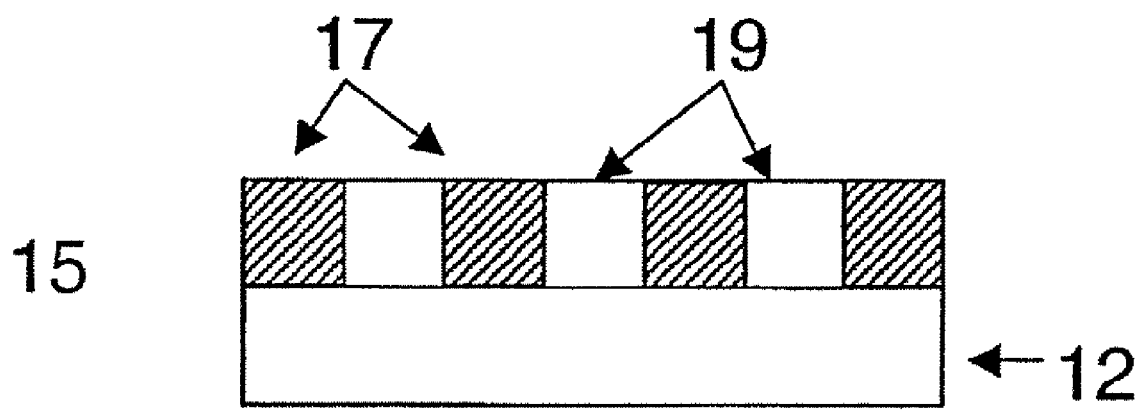
FIG. 2 is a cross-sectional view of an exemplary structure used to practice certain embodiments of the invention.

FIG. 2, for example, is a cross-sectional view of an exemplary structure 15 having a grating configuration. Surface metal regions 17 are separated from one another by insulating regions 19. The material of metal regions 17 may be selected from appropriate carbon nanotube growth catalysts, and the insulating regions 19 may be made from material that does not readily initiate carbon nanotube growth and genesis, such as silica. The separate metal catalyst layer regions 17 provide a region where nanotube growth originates.

The density of the nanotube ribbon may be controlled by altering such variables as catalyst composition and concentration, growth environment, including but not limited to growth time (e.g., less CVD run time yields less dense nanofabric), temperature, gas composition and concentration. Provided below are several exemplary ways of growing nanofabrics using the above principles.

Example 1

Figure 1C:
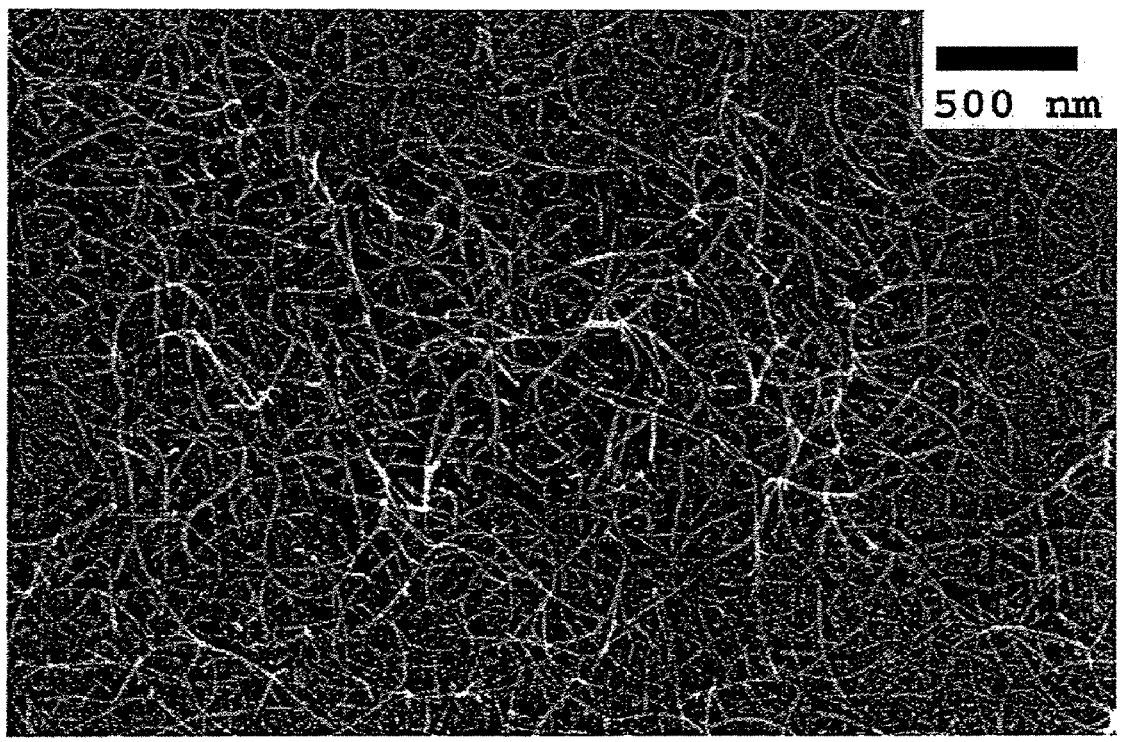
FIGS. 1C-1Z are micrographs of nanofabrics grown with exemplary processes according to certain embodiments of the invention.

Thin metal layers of aluminum, iron, and molybdenum (15 nm, 1 nm, and 2 nm, respectively) are sequentially deposited on a substrate. The substrate is placed in a tube furnace in which the temperature is ramped to 500° C. and held for thirty minutes, in an ambience of air. The temperature is then ramped to a CVD temperature of 850° C. in a flow of argon gas and hydrogen gas, at 100:400 sccm Ar:$H_2$ Upon reaching the CVD temperature, methane gas at a flow rate of 500 sccm is introduced into the furnace for a 1 minute growth time. Completing the CVD, the furnace is ramped down to below 200° C. in an argon atmosphere. FIG. 1C is a micrograph of a fabric made from this procedure.

Example 2

Figure 1D:
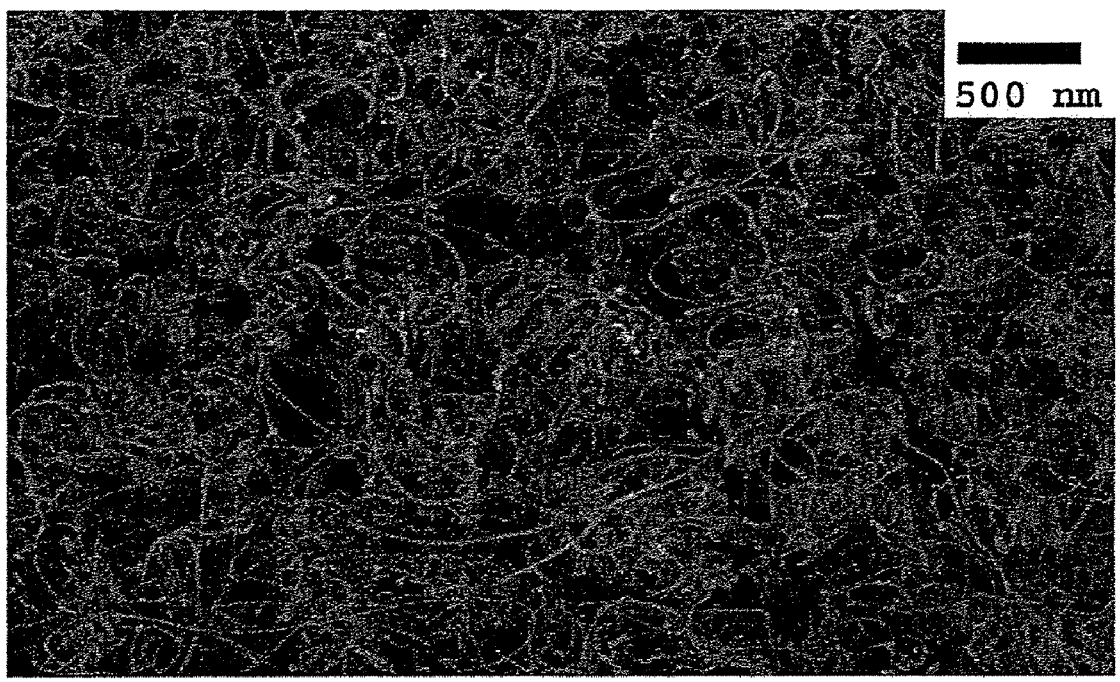
FIGS. 1B.1-1B.2 illustrate exemplary methods of growing nanotube fabric by CVD using the structure of FIG. 1A.

All parameters of example 1 are duplicated except in place of methane, ethylene is used at a flow rate of 5.0 sccm for 10 minutes, the CVD temperature is 800° C. The same types of metal layers are employed; however, the thicknesses of the metal layers used are 5 nm aluminum, 1 nm iron, and 2 nm molybdenum. FIG. 1D is a micrograph of the nanotube growth resulting from such use of ethylene.

Examples 3-6

Examples 3-6 show that the rate of methane gas flow affects the production of nanotube fabrics in typical CVD methods. From the micrographs one can see how the change in gas flow from 725 to 500 to 250 sccm affects the amount of growth. These examples show that the porosity and type of nanotubes grown may be controlled by changing specific parameters in the growth process. The growth of nanotubes is sustained over this range and can be finely controlled to generate primarily multilayer fabrics (750 sccm) to primarily monolayer fabrics (250 sccm). Reduction in gas flow to even lower levels is possible to assure primarily monolayer fabrics. An increase of the concentration would allow growth of fabrics with multilayers. Other parameters such as growth time and temperature can be controlled in concert with feedstock gas flow to provide more control over the fabric's characteristics.

Example 3

Figure 1E:
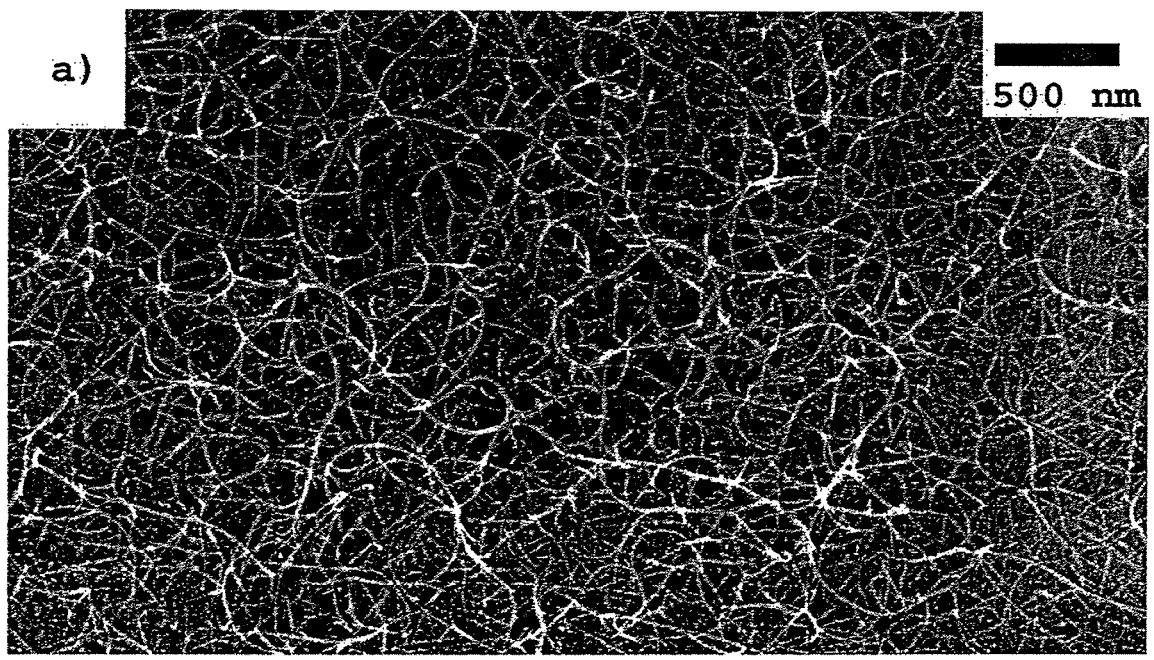

Methane is flowed at 725 sccm and the argon and hydrogen gas flow are kept constant at 100 sccm and 400 sccm, respectively. CVD is performed as above with the following parameters: the CVD is performed at 850° C. for 1 minute with the following metal layers: 15 nm aluminum, 1 nm iron and 2 nm molybdenum. FIG. 1E is a micrograph of the film which resulted from this procedure.

Example 4

Figure 1F:
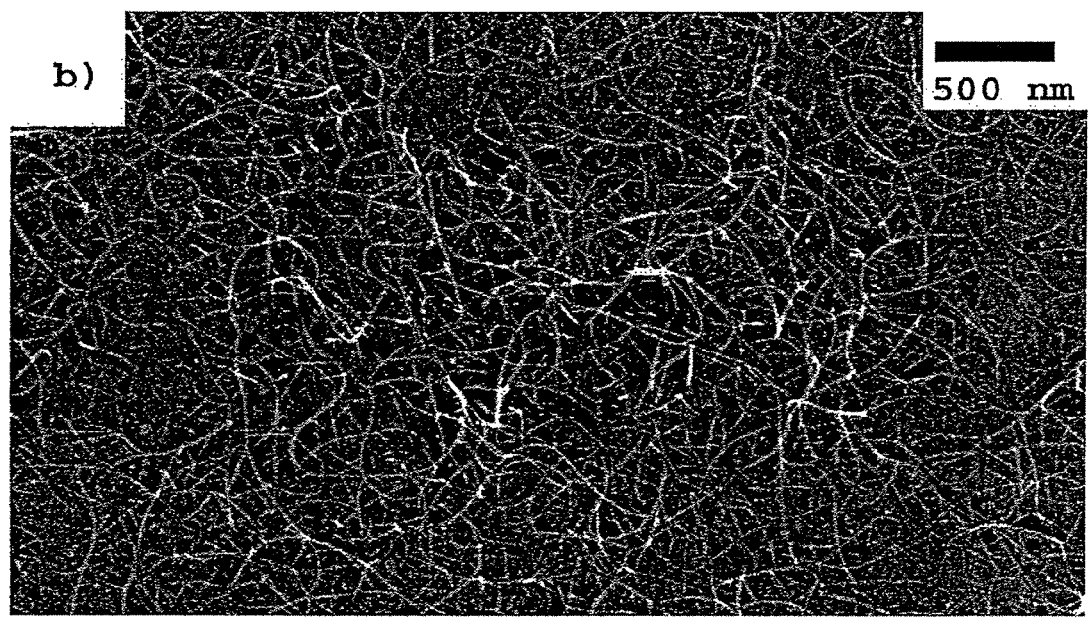

All parameters are kept the same as example 3 except methane gas flow is 500 sccm. FIG. 1F is a micrograph of the film which resulted from this procedure.

Example 5

Figure 1G:
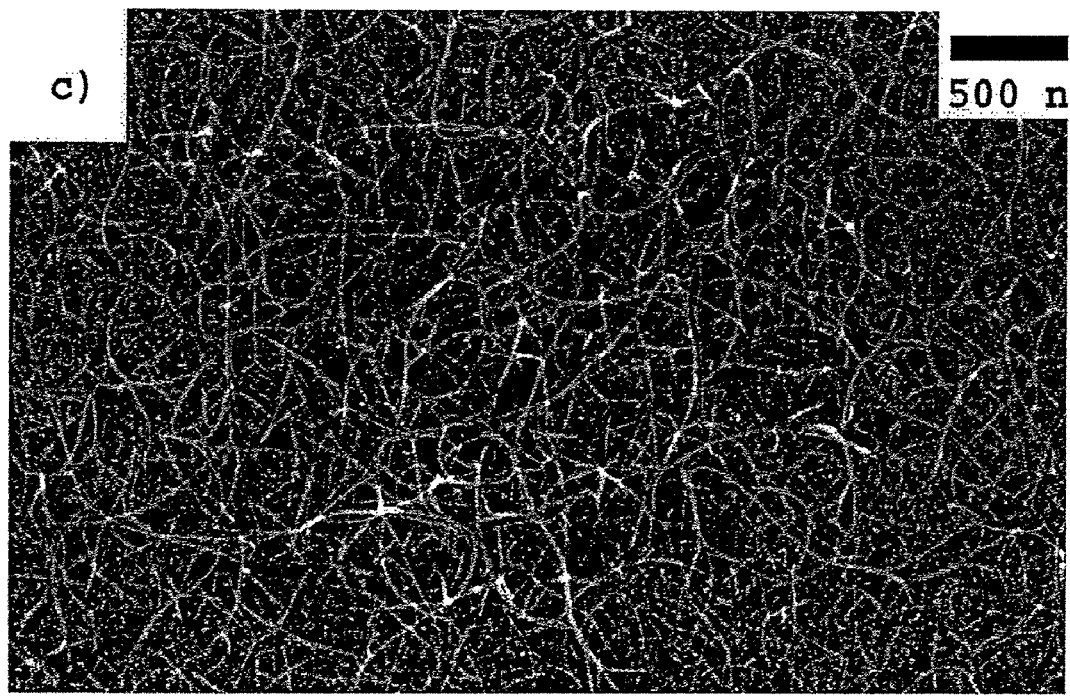

All parameters are kept the same as example 3 except methane gas flow is 250 sccm. FIG. 1G is a micrograph of the film which resulted from this procedure.

Example 6

Figure 1H:

All parameters are kept the same as example 3 except methane gas flow is 100 sccm. FIG. 1H is a micrograph of the film which resulted from this procedure.

Examples 7-9

Examples 7-9 mirror examples 3-6 in that the flow rates of ethylene gas used are decreased in sequential CVD processes, while keeping all other variables constant. As above, all of these examples show fine control may be achieved over the growth density, nanotube porosity, nanotube length and the resistance per square values. (Resistance per square is used to assess in general the porosity of the nanotubes and/or their overall conductive quality.) Figures for examples 7-9, respectively, show fabrics corresponding to decreasing the gas flow. As flow decreases, the fabric density decreases and resistance increases.

Example 7

Figure 1I:
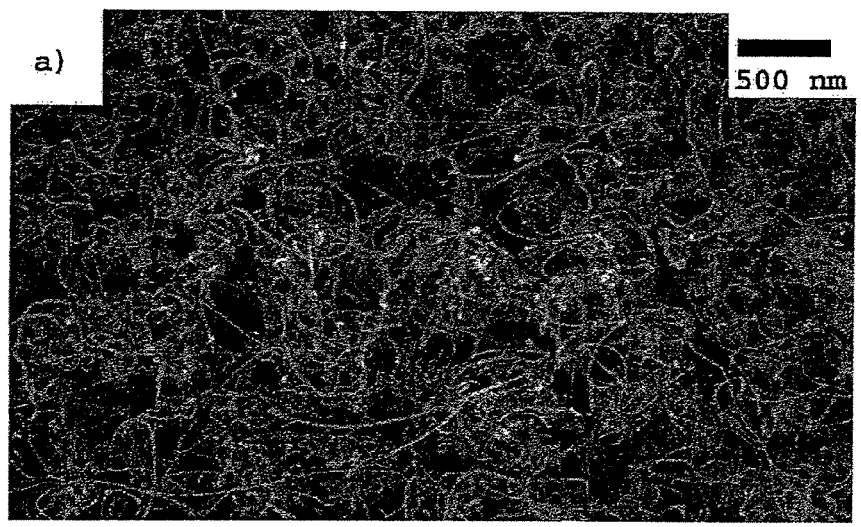

The argon flow and hydrogen flow are kept constant at 100 sccm and 400 sccm, respectively. Ethylene gas is flowed at 5.0 sccm. Metal layers are as follow: 5.0 nm aluminum, 1.0 nm iron and 2.0 nm molybdenum, the CVD temperature is 800° C., and is run for 10 minutes. FIG. 1I is a micrograph of the film, which resulted from this procedure.

Example 8

Figure 1J:
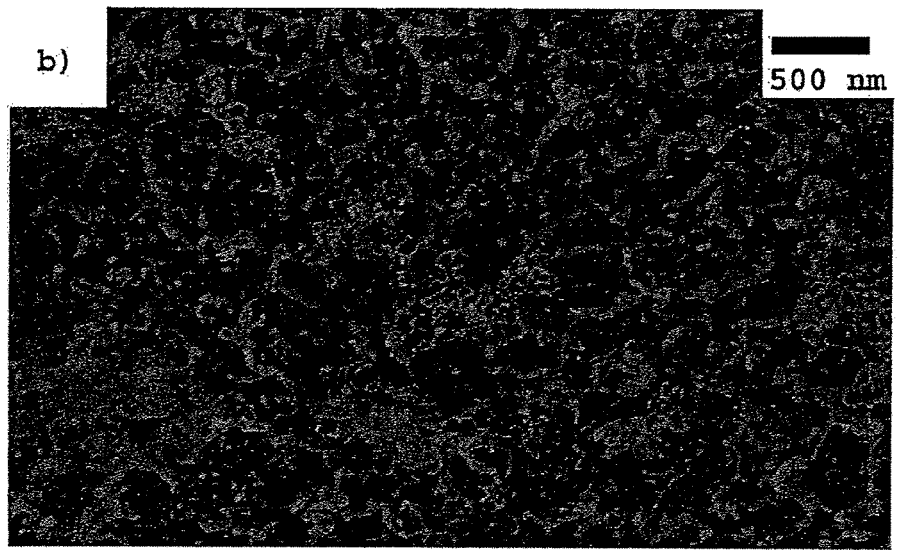

All parameters are kept the same as example 7 except ethylene gas flow is 2.5 sccm. FIG. 1J is a micrograph of the film which resulted from this procedure.

Example 9

Figure 1K:
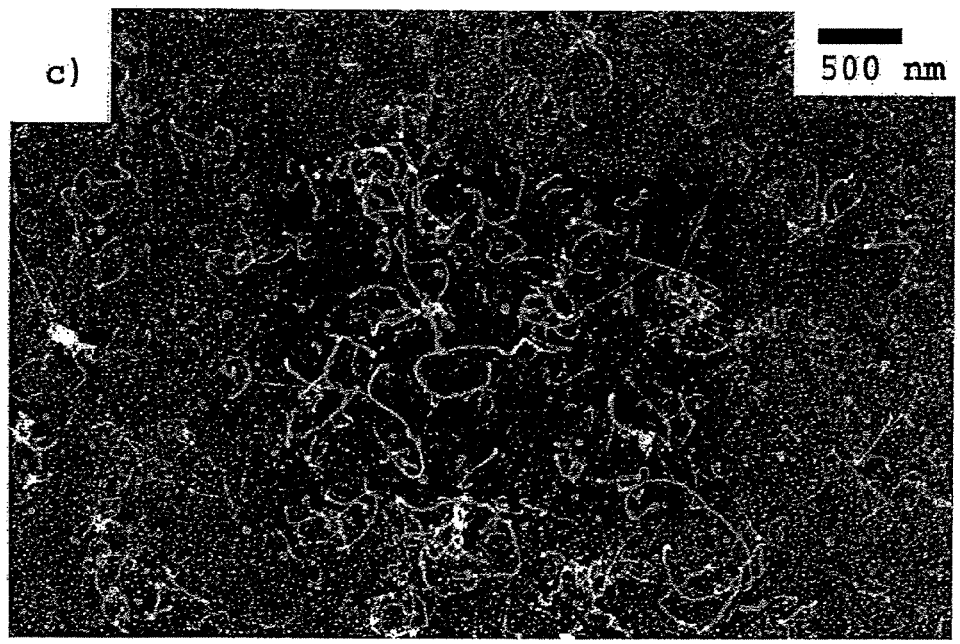

All parameters are kept the same as example 7 except ethylene gas flow is 1.0 sccm. FIG. 1K is a micrograph of the film which resulted from this procedure.

Examples 10-12

Examples 10-12 show the effects of reducing CVD temperatures while keeping all other parameters constant. The CVD methods are otherwise much the same as in example 1. These examples also show that fine control may be achieved in porosity, thickness and length of nanofabrics and nanotubes. Figures for examples 10-12, respectively, show fabrics corresponding to decreasing CVD temperatures. As the temperature decreases, the fabric density decreases, and the resistance increases.

Example 10

Figure 1L:
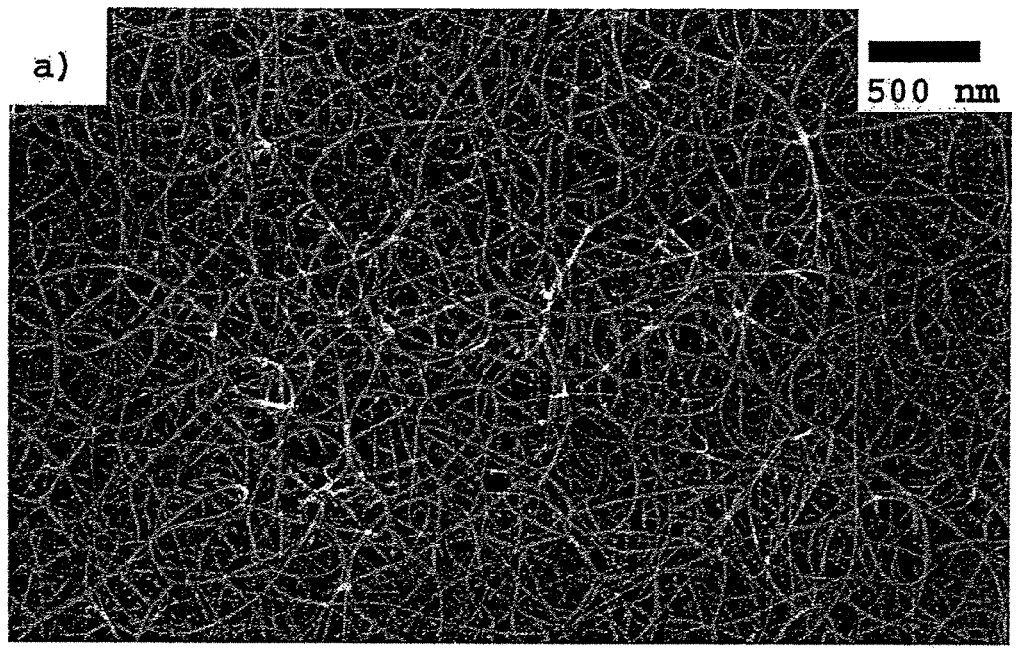

CVD is performed on a substrate of silicon coated with 15 nm aluminum, 1 nm iron and 2 nm molybdenum, using a 725 sccm flow of methane gas at 900° C. for ten minutes in Ar/H flow as above. FIG. 1L is a micrograph of the film which resulted from this procedure.

Example 11

Figure 1M:
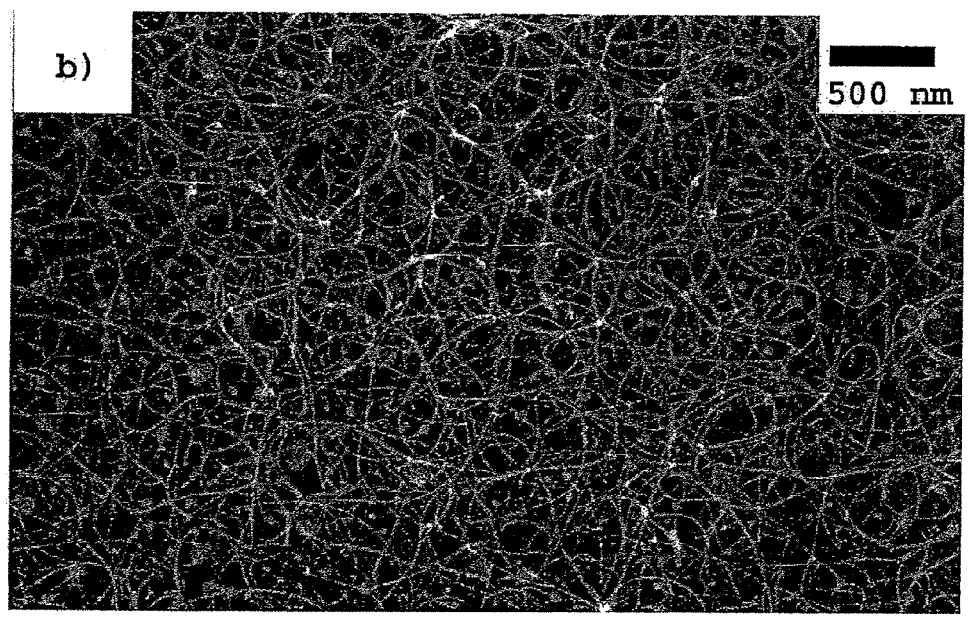

All parameters are kept the same as in example 10, except the CVD temperature is decreased to 850° C. FIG. 1M is a micrograph of the film which resulted from this procedure.

Example 12

Figure 1N:
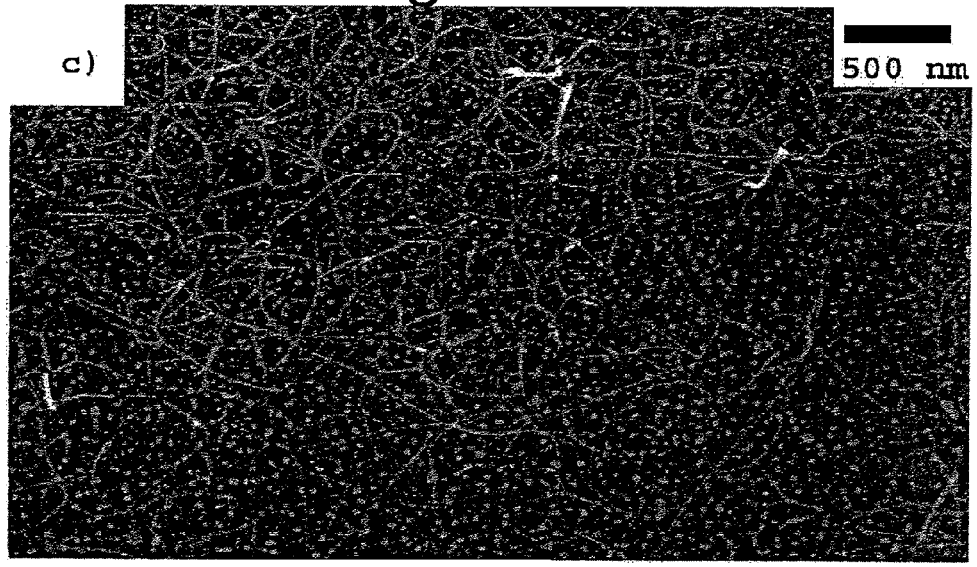

All parameters are kept the same as in example 10, except the CVD temperature is decreased to 800° C. FIG. 1N is a micrograph of the film which resulted from this procedure.

Examples 13-16

Figures for examples 13-16, respectively, show fabrics corresponding to decreasing CVD run time. As the run time decreases, the fabric density decreases, and the resistance increases.

Example 13

Figure 1O:
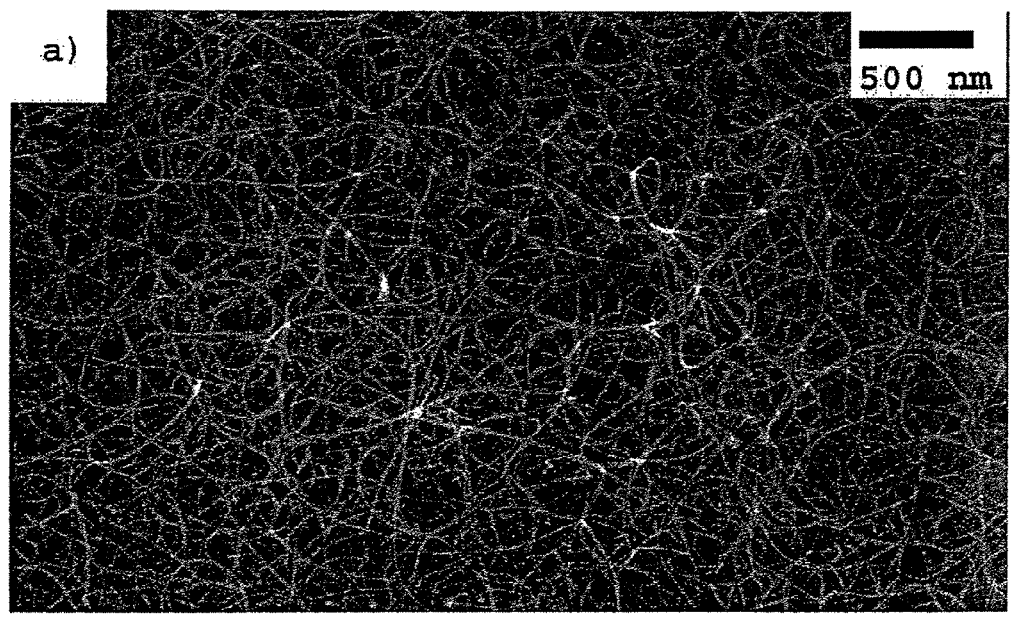

CVD is run for 10 minutes on a substrate of silicon coated with 15 nm aluminum, 1 nm iron, and 2 nm molybdenum at 850° C. in a 725 sccm flow of methane gas and 100:400 sccm Ar:$H_2$ as above. FIG. 1O is a micrograph of the film which resulted from this procedure.

Example 14

Figure 1P:
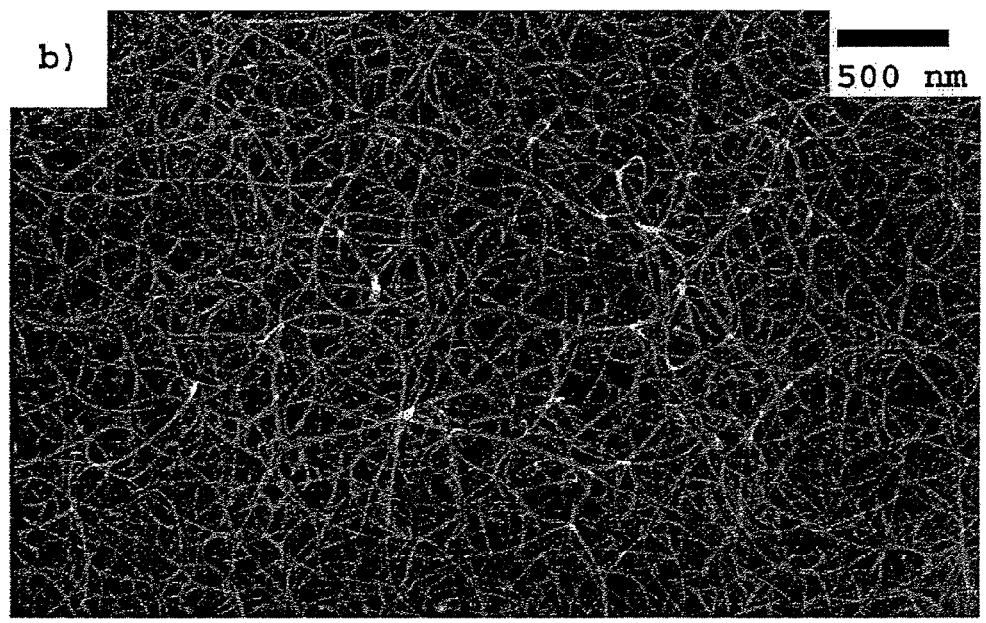

All parameters are kept the same as example 13, except the CVD run time is decreased to five minutes. FIG. 1P is a micrograph of the film which resulted from this procedure.

Example 15

Figure 1Q:
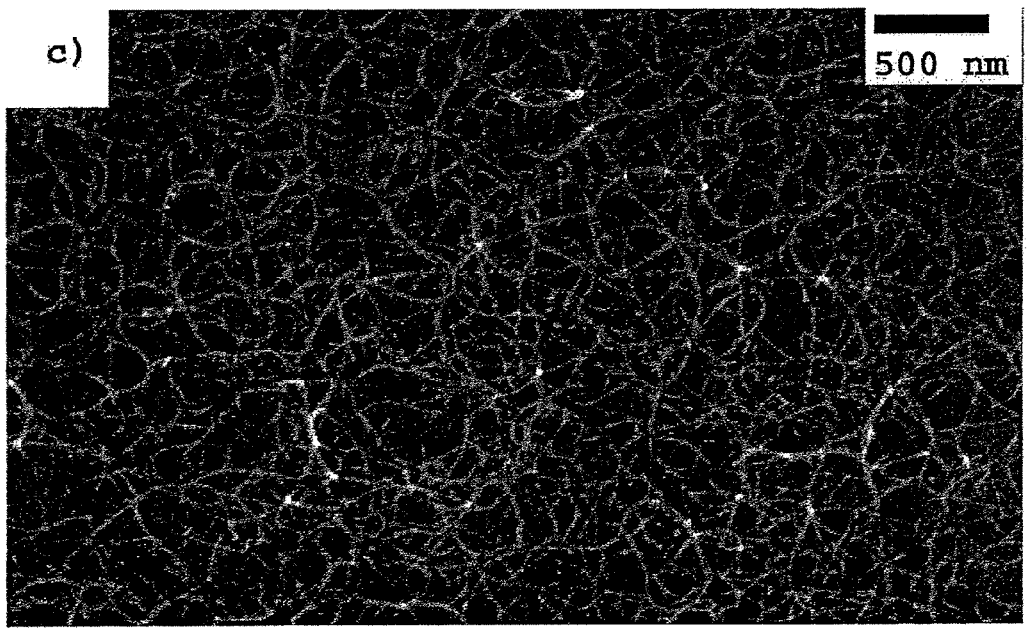

All parameters are kept the same as in example 13, except the CVD run time is decreased to two minutes. FIG. 1Q is a micrograph of the film which resulted from this procedure.

Example 16

Figure 1R:
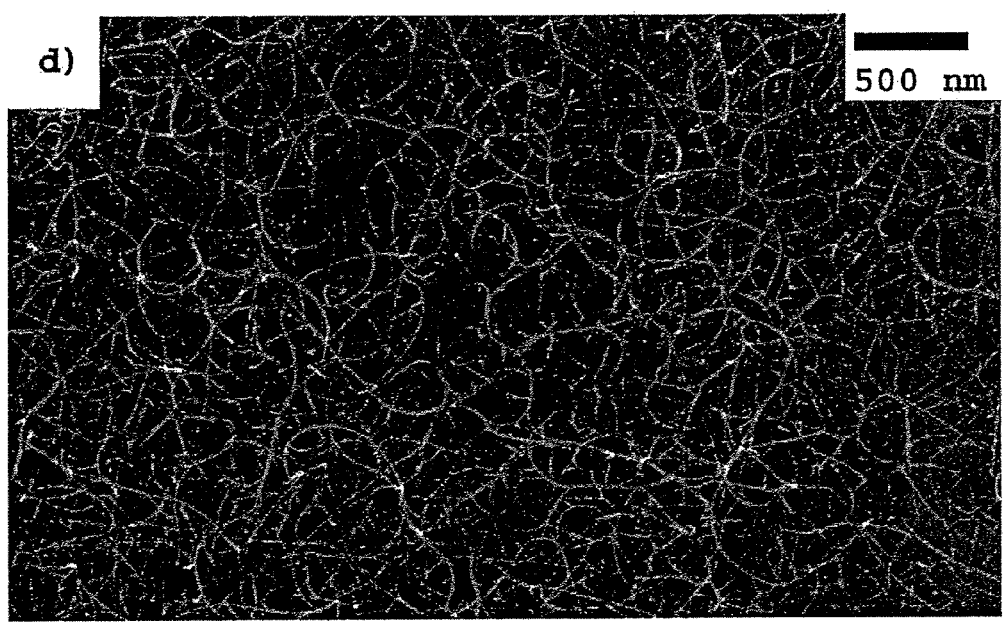

All parameters are kept the same as in example 13, except the CVD run time is decreased to one minute. FIG. 1R is a micrograph of the film which resulted from this procedure.

Examples 17-20

Examples 17-20 show the effect that varying the thicknesses of the aluminum metal layer has on the resulting films. As above, all of these examples show fine control may be achieved over the growth density, nanotube porosity, nanotube length and the resistance per square values. Figures for examples 17-20, respectively, show fabrics corresponding to decreasing thickness of the metal layer catalyst. As the thickness decreases, the fabric density decreases, and the resistance increases.

Example 17

Figure 1S:
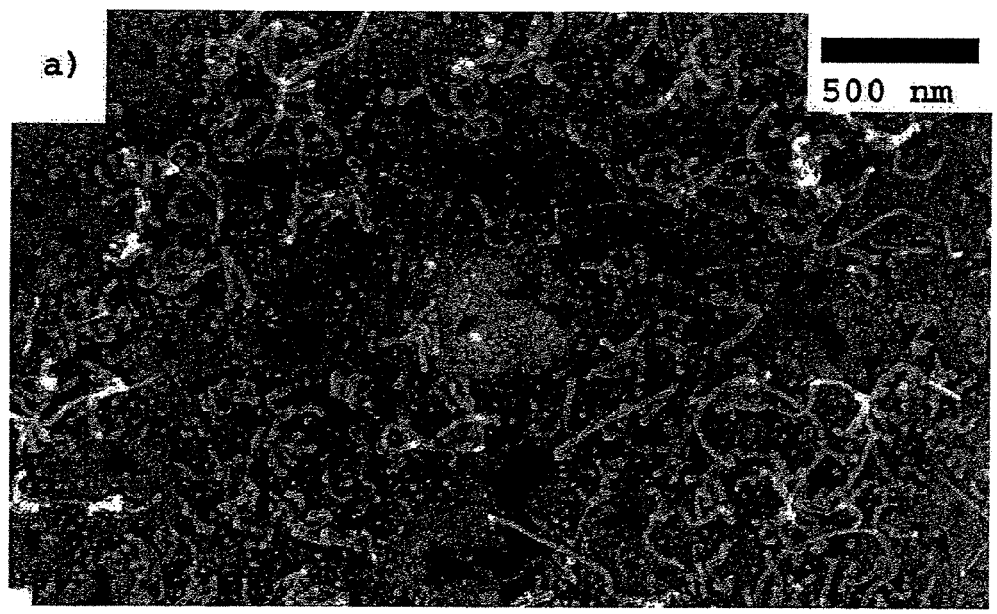

CVD is performed on a substrate of silicon coated with 25 nm aluminum, 1 nm iron and 2 nm molybdenum, using a 725 sccm flow of methane gas and the argon and hydrogen gas flow are kept constant at 100 sccm and 400 sccm, respectively, at 850° C. for ten minutes. FIG. 1S is a micrograph of the film which resulted from this procedure.

Example 18

Figure 1T:
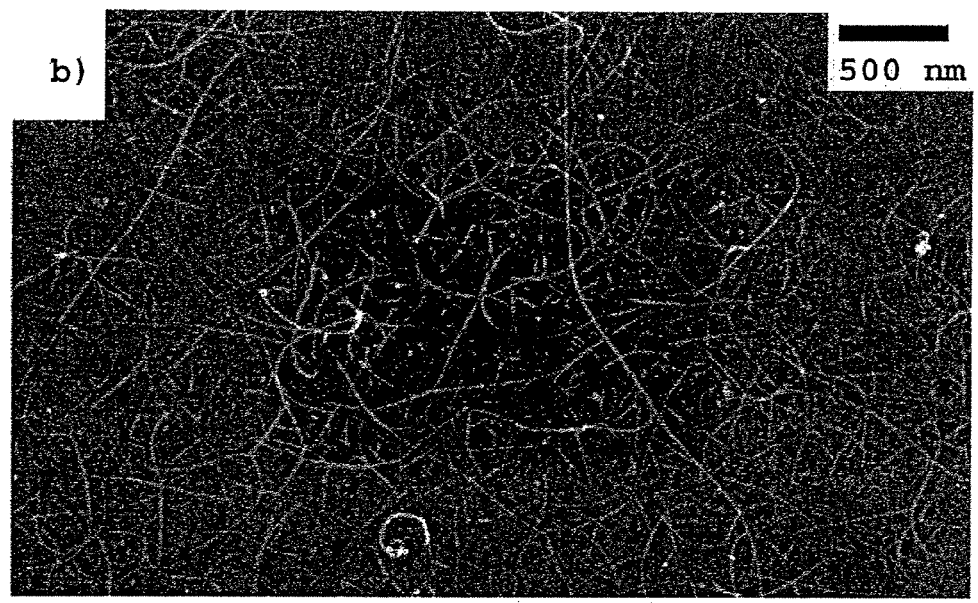

All parameters are kept the same as in example 17, except the thickness of the aluminum layer is decreased to 15 nm. FIG. 1T is a micrograph of the film which resulted from this procedure.

Example 19

Figure 1U:
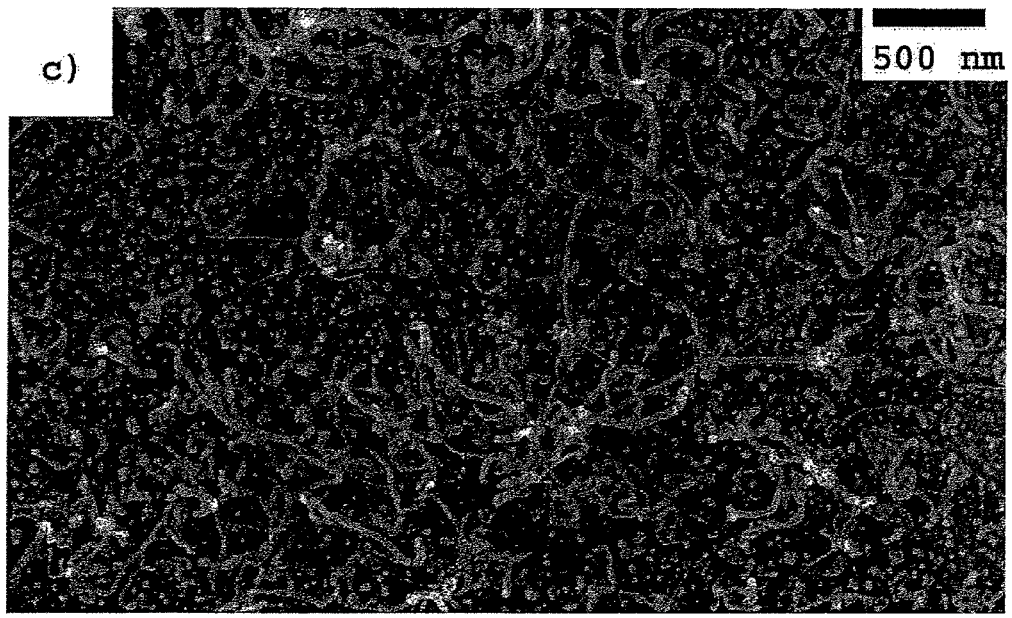

All parameters are kept the same as in example 17, except the thickness of the aluminum layer is decreased to 5 nm. FIG. 1U is a micrograph of the film which resulted from this procedure.

Example 20

Figure 1V:
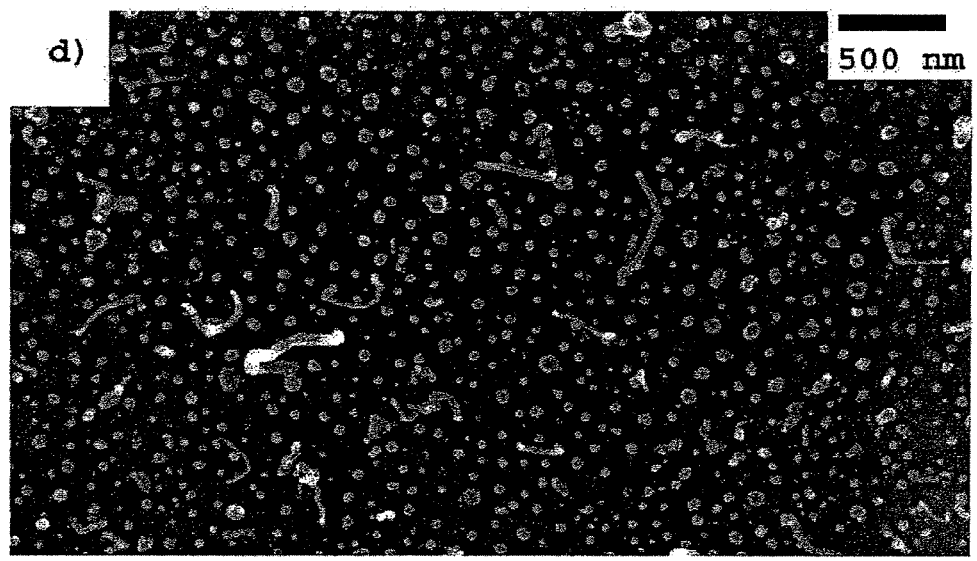

All parameters are kept the same as in example 17, except the thickness of the aluminum layer is decreased to 0 nm (no aluminum is deposited in this example). FIG. 1V is a micrograph of the film which resulted from this procedure.

Examples 21-22

Examples 21-22 show the results of altering thin metal layer thickness and using silicon dioxide as substrate. Altering the metal layer thickness allows tuning of the porosity and specifically the type of nanotubes. Thicker layers are more conducive to growing MWNTs while thinner layers grow better SWNTs and leave less residual metal because they are vaporized at the high temperatures of nanotube growth. Figures for examples 21-22, respectively, show fabrics corresponding to decreasing thickness of the metal layer catalyst. As the thickness decreases, the fabric density decreases, and the resistance increases.

Example 21

Figure 1W:
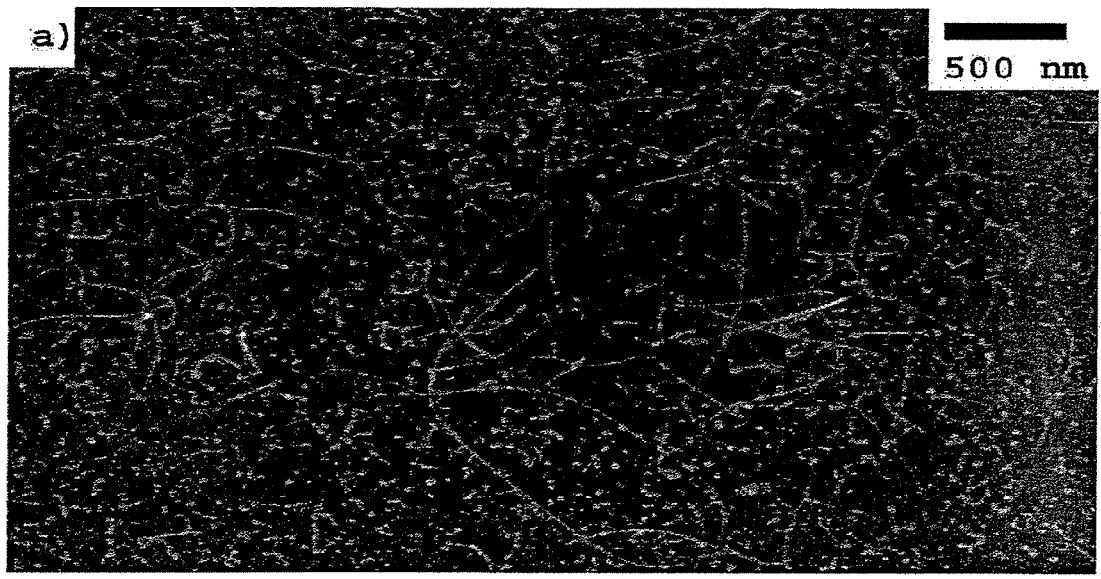

CVD is performed on a silicon dioxide substrate coated with thin metal layers; 2.0 nm aluminum, 0.5 nm iron and 1.0 nm molybdenum at 850° C. in a 500 sccm flow of methane gas in 100:400 sccm Ar:$H_2$ for one minute. FIG. 1W is a micrograph of the film which resulted from this procedure.

Example 22

Figure 1X:
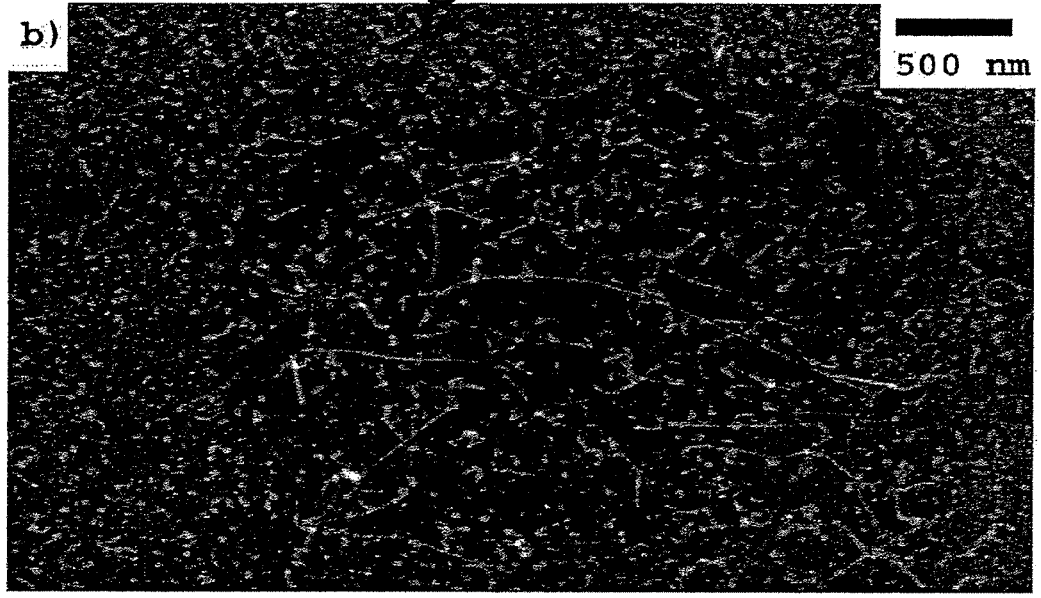

All parameters are kept the same as example 21, except thin metal layers of the following thicknesses; 1.0 nm aluminum, 0.5 nm iron and 1.0 nm molybdenum were used. FIG. 1X is a micrograph of the film which resulted from this procedure.

Examples 23-24

Examples 23 and 24 show the films that are grown by CVD on silicon and silicon dioxide substrates. These examples illustrate control over porosity even on different substrates. Here we have an example of a semiconducting substrate and an insulating substrate. Growth is achievable on a variety of substrate layers allowing ready integration into typical semiconductor process flows and ease of manufacture. Figures for example 23 and 24 show that the fabric density changes with the type of substrate, and thus resistance changes.

Example 23

Figure 1Y:
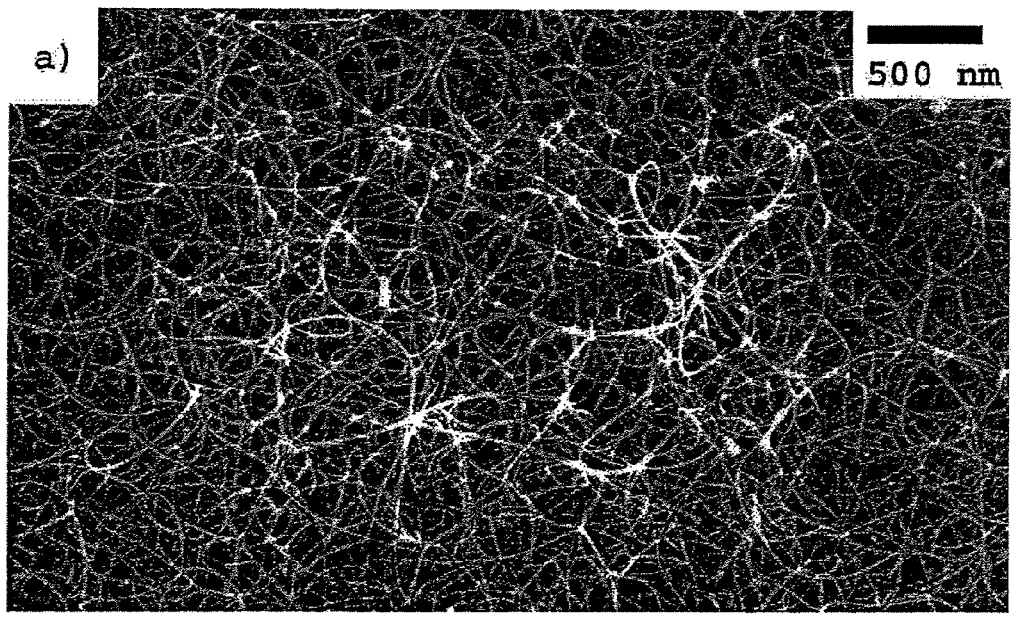

CVD is performed on a silicon substrate coated with thin metal layers; 15 nm aluminum, 1.0 nm iron and 2.0 nm molybdenum at 850° C. in a 500 sccm flow of methane gas for two minutes. FIG. 1Y is a micrograph of the film which resulted from this procedure.

Example 24

Figure 1Z:
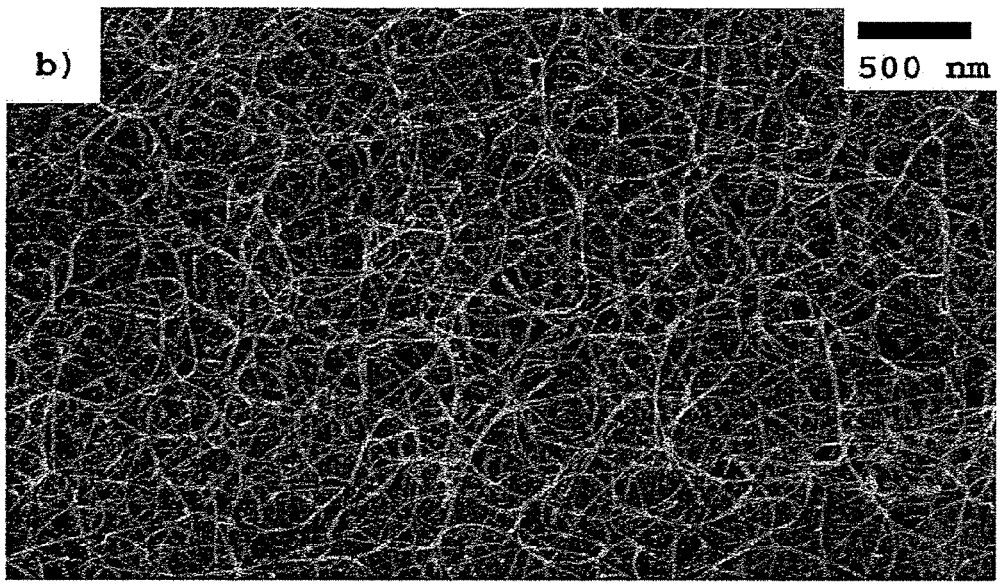

All parameters are kept the same as example 23, except silicon dioxide is used as substrate. FIG. 1Z is a micrograph of the film which resulted from this procedure.

Growing Nanofabrics with Nanoparticles

Another preferred method of growing nanofabrics uses metallic or metal oxide nanoparticles (e.g., iron oxide) as carbon nanotube growth catalyst. Metallic or metal-oxide nanoparticles have a narrow range of diameters. This narrow range can lead to more effective control over the diameter and type of nanotubes forming the eventual nanofabric. The surface of the substrate used can be derivitized to create a more hydrophobic or hydrophilic environment to promote better adhesion of the catalyst particles. The nature of the substrate allows control over the level of dispersion of the nanoparticles to a precision sufficient to generate monolayer nanotube fabrics.

Figure 3A:
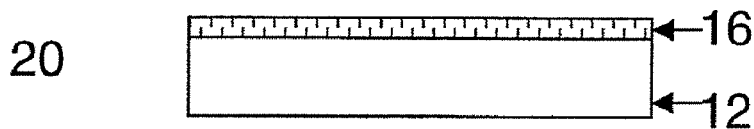
FIG. 3A shows a structure, according to certain embodiments of the invention, having a distribution of nanoparticles that may be used in an exemplary method of growing nanofabric.

FIG. 3A shows a cross-sectional view of an exemplary structure 20 used to grow nanofabrics. A substrate 12 has a distribution 16 of metallic or metal oxide nanoparticles thereon. (For simplicity, the figure shows the distribution as a continuous layer, though people skilled in the art will appreciate that in reality the structure 20 will have a distribution of relatively discrete nanoparticles.) The substrate surface used for generation of carbon nanotubes may be any material including, but not limited to, silicon, thermal oxide, silicon oxide, silicon nitride, tungsten, tungsten/titanium and other typical insulators, semiconductors and metallic surfaces commonly used in CMOS and semiconductor fabrication processes the surface may have electronic components and patterns already defined therein, as mentioned above, and the substrate may be functionalized or non-functionalized.

Figure 3B:
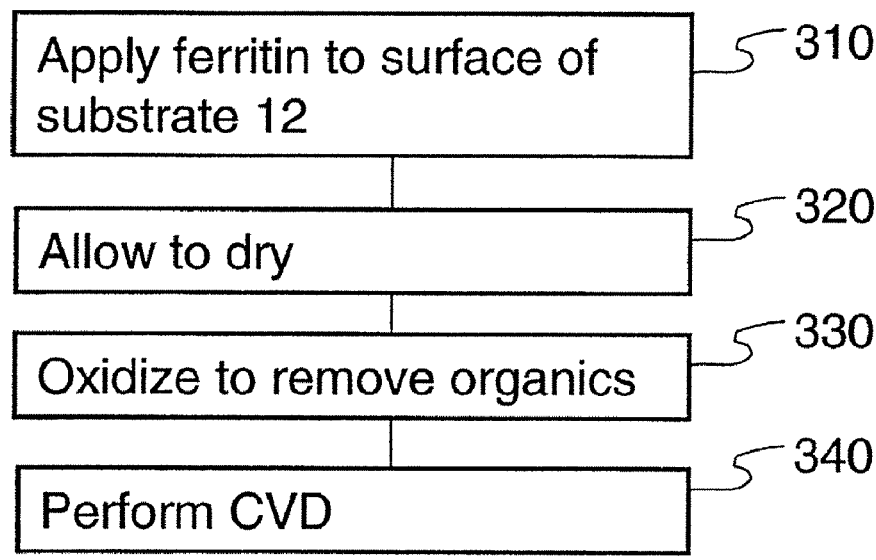
FIG. 3B-C illustrate exemplary methods of growing nanotube fabric by CVD using the structure of FIG. 3A.

FIG. 3B illustrates a way of growing a nanofabric using a substrate coated with nanoparticles 16. A mixture of ferritin and water is created. For example, ferritin dissolved in deionized (DI) water at a typical concentration (1-1000 µM) (SIGMA catalog) is provided. The ferritin contains naturally encapsulated iron in an organic layer or shell, and can be processed so that the encapsulated iron may be used in subsequent nanotube generation. This shell is oxidized using air or oxygen oxidation or plasma ashing, which causes its removal leaving only an iron oxide nanoparticle. During CVD growth of nanotubes the iron oxide nanoparticles are reduced to leave metallic iron nanoparticles which catalyze the growth of nanotubes. The purpose of using ferritin or any appropriate nanoparticles is to cause the nanoparticles to be dispersed on the surface in an even fashion (monodisperse). Ferritin particles have a very narrow diameter range as do the nanoparticles discussed below.

The ferritin solution is applied 310 to a surface of substrate 12. Before application the substrate can be derivitized to make it more hydrophilic or hydrophobic in order to promote adhesion of the ferritin to the surface. The substrate is allowed to dry 320 (e.g. approximately five minutes has been found to be sufficient). This leaves a coating of ferritin on the surface of the substrate. The protein shells are then removed 330 from the ferritin particles. For example, the structure may be subjected to either an oxidation operation at 400-800° C. for about 15 minutes, or it may be subjected to a plasma ashing operation. The oxidation process removes substantially all of the proteinaceous shell from the ferritin, thereby leaving behind a coating 16 of nanoparticles of iron oxide. The nanoparticles are approximately two to five nanometers in diameter, or more particularly approximately three nanometers in diameter. (See Li, 46 Journal Physical Chem. above.) Once catalyst particles from ferritin are formed, CVD may be performed 340 to grow a nanofabric of nanotubes. The nanofabric may be grown, for example, over an entire wafer surface as a monolayer of contacting nanotubes. The above embodiment is conducive to growing a conductive (primarily) monolayer fabric with sufficient density to remain suspended over a switching junction.

Under yet other embodiments, metal ligand-catalyst precursor molecules are used to deposit metallic nanoparticles on a functionalized substrate surface to thereby help create growth of nanotubes. Typically, the formula of the metal/ligand complex will have a formula such as ML, in which M is a metal such as iron, cobalt, or nickel, and L is one or more organic ligands having an affinity for the metal. One general formula may be $C_xH_y$ (COOH), but other carbon, oxygen, nitrogen and/or sulfur-containing ligands are known and may be used. A metallic nanoparticle ligated to an organic moiety is deposited on a functionalized substrate surface. The surface is functionalized to optimize ligand bonding during spin coating, a procedure which may result in minimal deposition of untreated nanoparticles. Certain embodiments use a generic method to synthesize metallic nanoparticles with organic shells which have a very specific size regime for example 3-5 nm which can be monodisperse on a substrate.

Certain embodiments use prefabricated iron oxide particles as carbon nanotube growth catalyst. Iron oxide nanoparticles are applied to a substrate in a concentration sufficient to support the desired density of nanotube growth. The substrate is then subjected to a CVD operation as described herein. The substrate, optionally, can be dried and/or oxidized prior to beginning the CVD run. For example, iron oxide nanoparticles may be applied to a substrate surface by spin coating. In one embodiment, iron oxide is suspended in deionized water at a 1:10 ratio. The aqueous iron suspension is applied to a substrate surface, and the surface is spun at approximately 1000 rpm to distribute the suspension. The surface is then spun at 4000 rpm to dry the suspension. More than one application of iron oxide nanoparticles may be performed. The number of applications of iron oxide nanoparticles required will vary depending on the concentration of the suspension used, the desired resulting surface density of nanoparticles, the physical properties of the desired fabric, and the physical properties of the substrate used.

Figure 3C:
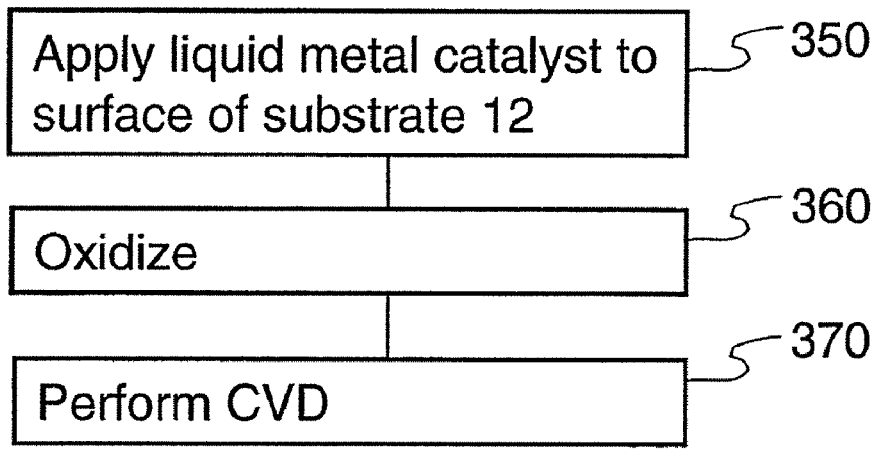

Under yet other embodiments, a liquid catalyst precursor suspension is used. FIG. 3C illustrates a way of growing a nanofabric using liquid metal catalyst. A liquid metal catalyst is created. For example, a dissolved metal catalyst, e.g., iron nitrate $(Fe(NO_3)_3$, is mixed with methanol and applied onto a substrate 350. The substrate is oxidized 360, e.g., by ashing, thereby leaving a dispersion of iron oxide nanoparticles on the surface of the substrate. The substrate is then subjected to a CVD operation 370 to grow nanotubes. Provided below are several exemplary ways of growing nanofabrics using the above principles.

Example 25

Figure 3D:
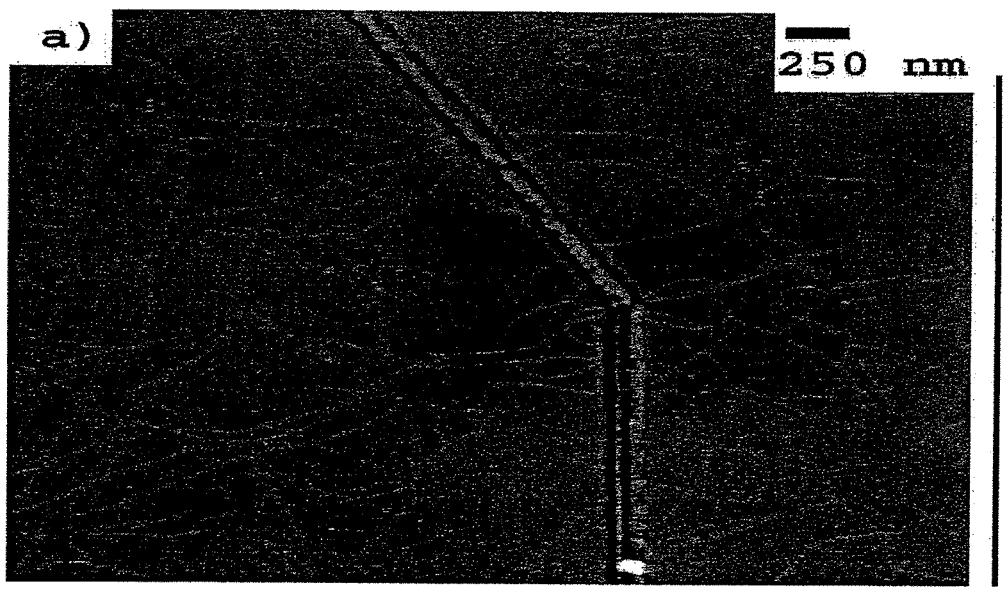
FIGS. 3D-3F are micrographs of nanofabrics grown with exemplary processes according to certain embodiments of the invention.

This is an example of nanoparticles using metal-ligand catalyst precursor molecules. HMDS (hexamethyldisilane) is spun onto a silicon dioxide substrate at 4000 rpm for one minute as an adhesion layer. Iron nanoparticles are made by dissolving $Fe(NO_3)_3$ in solution of a lauric acid in methanol at a ratio of 1:3.3 Fe: lauric acid. The nitrate solution is evacuated to pump off nitric acid, and the solvent. The dried iron nanoparticles are then added to 10 mL toluene and 10 mL isopropanol to resuspend the nanoparticles in solution. The Fe nanoparticle solution is then diluted 1:25 in isopropanol. The iron nanoparticles in a 1:25 iron nanoparticle solution in isopropanol is then deposited on the wafer by spinning at 1000 rpm for 30 seconds, then at 4000 rpm for 20 seconds. Two Fe nanoparticle applications are deposited and spun. The substrate is baked at 100° C. to remove the solvent, it is then ashed for 30 minutes in $O_2$ plasma, CVD is performed at 850° C. for ten minutes in a 500 sccm flow of methane and a 100:400 sccm flow of $Ar:H_2$. FIG. 3D is a micrograph of a nanofabric which resulted from this procedure. The nanoparticles in this embodiment can be tuned to a particular size by changing the organic ligand (analogous to the protein shell of ferritin) that is bound to the metal. Additionally, nanoparticles of different metal or metal oxide species may be mixed together in a solution and applied for use as catalyst, e.g., 50% Fe and 50% Co, or 33% Fe 33% Co and 33% Al, or any other appropriate combinations.

Example 26

Figure 3E:
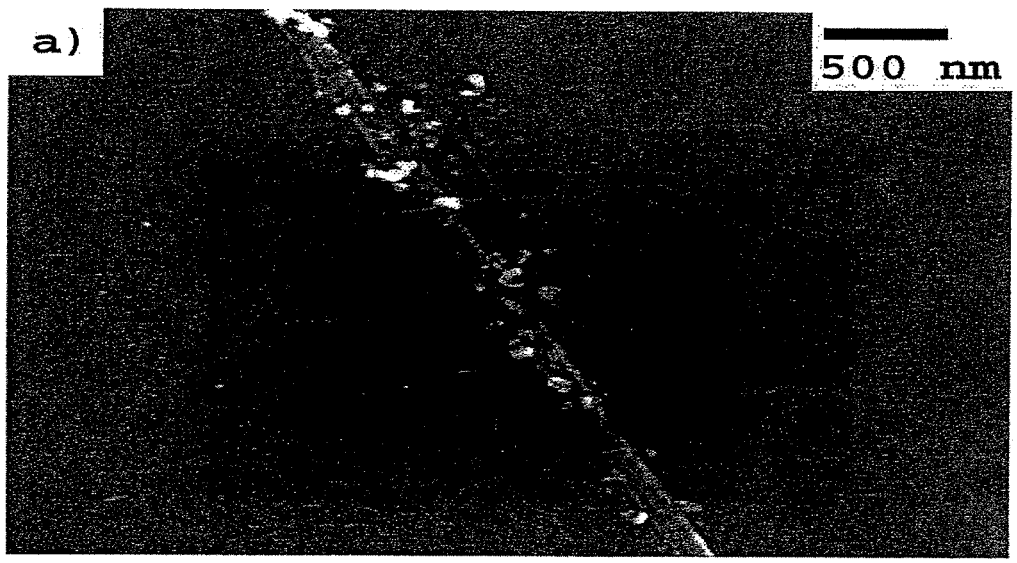

This is an example of iron nanoparticles in solution which are dispersed onto a silicon dioxide substrate and not spin coated on the surface. After the catalyst is dispersed onto the surface, the substrate is allowed to stand for 5 min., covered, and baked at 100° C. to remove solvent, and it is ashed. CVD is performed at 850° C. for ten minutes in a 500 sccm flow of methane and a 100:400 sccm flow of Ar: $H_2$. FIG. 3E is a micrograph of a nanofabric which resulted from this procedure.

Example 27

Figure 3F:
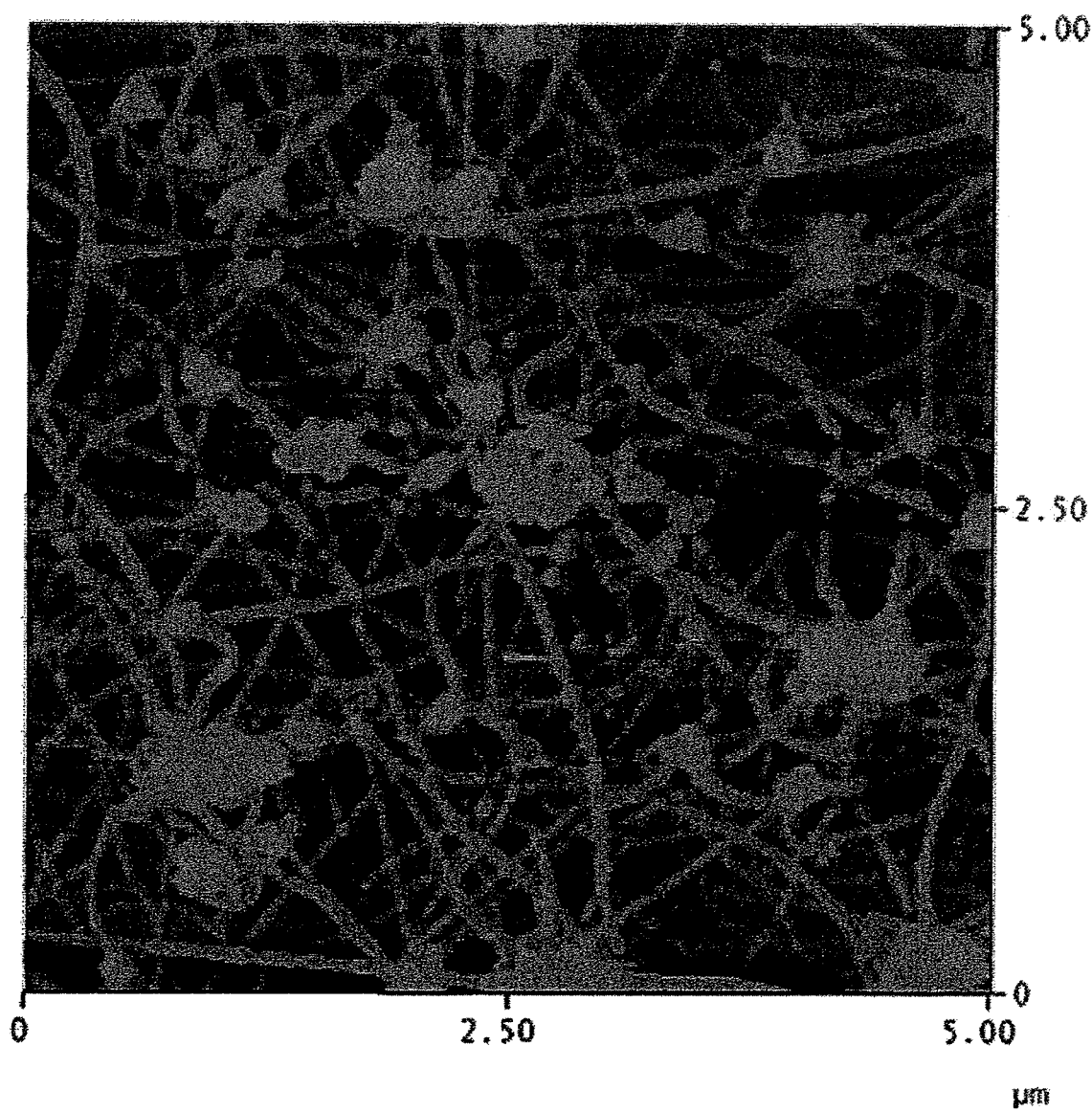

Example 27 demonstrates the growth of carbon nanotubes from a substrate with ferritin on the surface. The process involves the use of ferritin as a catalyst precursor. A 1:10 mixture of ferritin in deionized water is applied to a silica surface of a wafer. The wafer is dried, leaving a dispersed coating of ferritin on the surface of the substrate. The substrate is oxidized to remove all non-iron, organic matter and placed in the oven. The oven is ramped to 700° C. for 10 minutes in $Ar:H_2$, then it is ramped to 800° C. for seven minutes in $Ar:H_2$. CVD is performed at 800° C. with a 10 sccm flow of ethylene for 40 minutes in 600:400 sccm $Ar:H_2$. FIG. 3F shows a FESEM micrograph of carbon nanotubes grown using ferritin as catalyst precursor.

Growing Nanofabrics with a Combination of Nanoparticles and Thin Metal Layers

Another preferred method of growing nanofabrics uses nanoparticles in conjunction with thin metal layers on a substrate surface. This method allows one to easily distribute catalyst particles while taking advantage of the ease of thin layer deposition and their properties in assisting the process of growing nanotubes. Recall that aluminum and molybdenum are useful in generating surface carbon precursors that grow nanotubes.

Figure 4A:
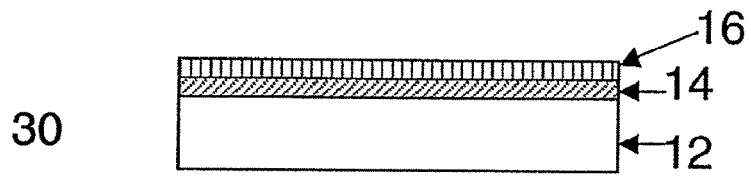
FIG. 4A shows a structure, according to certain embodiments of the invention, having a thin layer of metal catalyst and having a distribution of nanoparticles that may be used in an exemplary method of growing nanofabric.

FIG. 4A shows a cross-sectional view of an exemplary structure 30 used to grow nanofabrics. A substrate 12 has a thin layer 14 of metal catalyst and a distribution 16 of nanoparticles thereover. The substrate surface used for generation of carbon nanotubes may be any material including, but not limited to silicon or thermal oxide, e.g. silicon oxide, alumina. The uppermost layer can be an insulator, semiconductor or metal. Typical substrates which are of interest include silicon dioxide ($SiO_2$), silicon nitride ($Si_3N_4$), titanium, titanium/tungsten and others used in standard CMOS and semiconductor processing. The surface may have already formed therein various components and structures (e.g., gratings) of the aforementioned materials. In addition, the surface may be functionalized or non-functionalized.

Figure 4B:
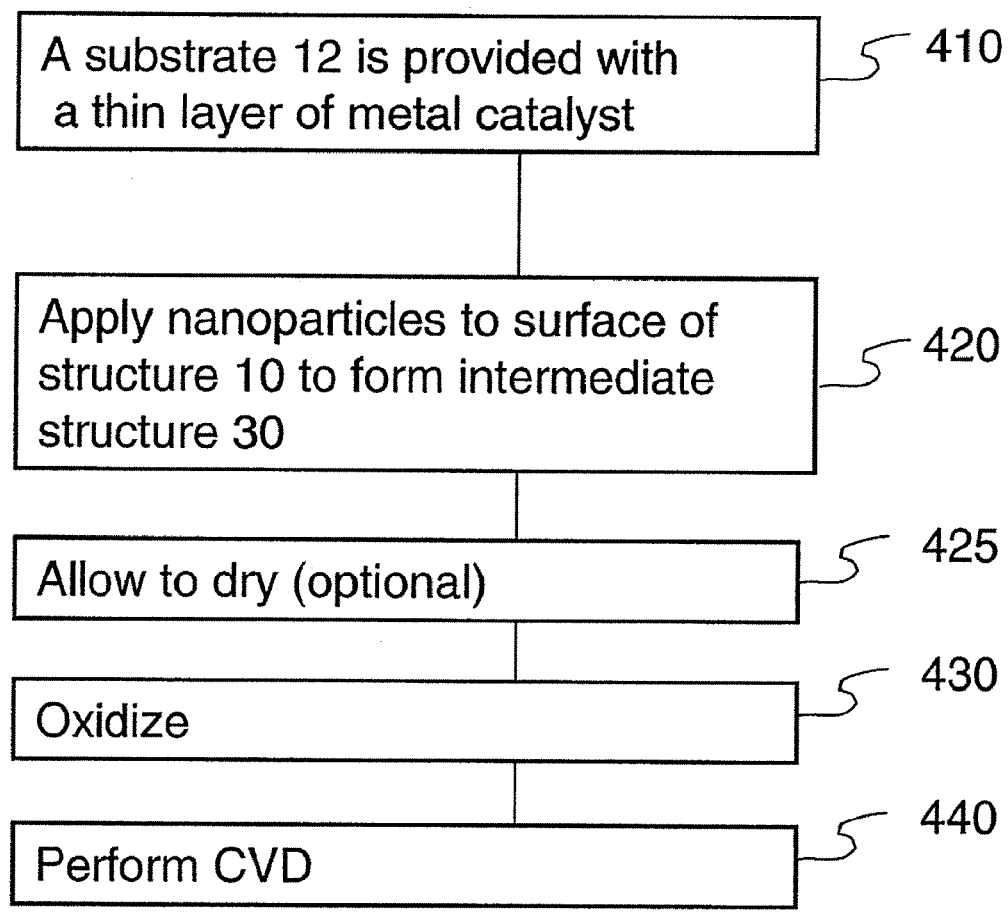

FIG. 4B illustrates a way of growing a nanofabric of carbon nanotubes (e.g., to cover a wafer surface) by using nanoparticles in conjunction with thin metal layers. First, a substrate 12 is provided and a thin layer of metal catalyst is provided 410 to at least selected regions of a wafer or perhaps an entire wafer surface, as described above. This forms layer 14 of metal catalyst. Thereafter, a distribution of nanoparticles 16 is applied 420 to the surface of layer 14. This may be done using any of the above methods of applying nanoparticles, e.g., spin coating suspensions of nanoparticles. Catalyst precursors such as ferritin, liquid metal catalyst precursor and metal ligand-catalyst precursor molecules may also be used in conjunction with thin metal layers on substrates to grow carbon nanotube fabrics. Depending on how the nanotubes are applied, the substrate may be dried (optionally) 425. The substrate is oxidized 430. Once so formed, the structure 30 may be subjected to a CVD process 440 to form a nanofabric.

Forming Nanofabrics with Pre-Formed Nanotubes

Introduction

One preferred method of forming a nanofabric uses spin coating techniques in conjunction with pre-formed nanotubes. Nanotubes should be sufficiently free of amorphous carbon if the nanotubes are to be used as electronic elements. Among other advantages, this technique is more conducive to semiconductor manufacturing environments than growth of nanotubes by CVD because it uses a room temperature process that does not contribute to the thermal budget of the standard CMOS process flows or semiconductor manufacturing methods. Additionally, the overall cost of this integration of nanotubes is very inexpensive.

Figure 5A:
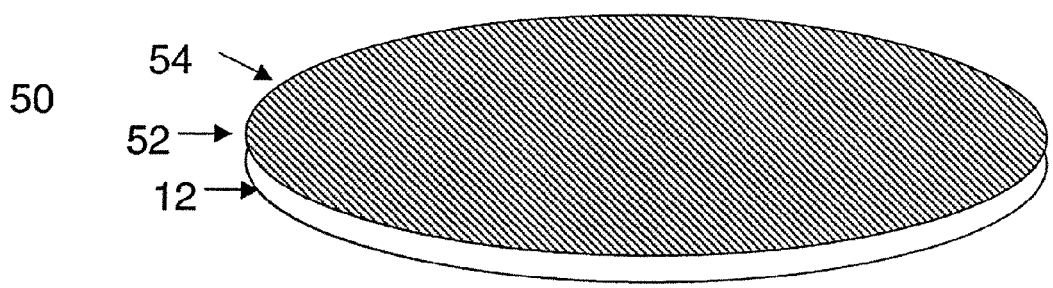
FIG. 5A shows a structure, according to certain embodiments of the invention, in which a nanofabric is formed over a substrate.

FIG. 5A shows an exemplary structure 50 having a wafer substrate 12 and a nanofabric 54 thereover. The nanofabric 54 may be made to cover an entire wafer surface.

An exemplary, non-limiting substrate 12 is like those described above. The substrate may be any material that will accept the deposition of nanotubes by spin coating, but preferably a material chosen from the group consisting of a thermal oxide or nitride, including but not limited to silicon dioxide, silicon nitride, alumina on silicon, or any combination of the following on silicon or silicon dioxide: aluminum, molybdenum, iron, titanium, platinum, and aluminum oxide, or any other substrate useful in the semiconductor industry.

Spin Coating Nanotubes on Functionalized Substrate Surfaces

Figure 5B:
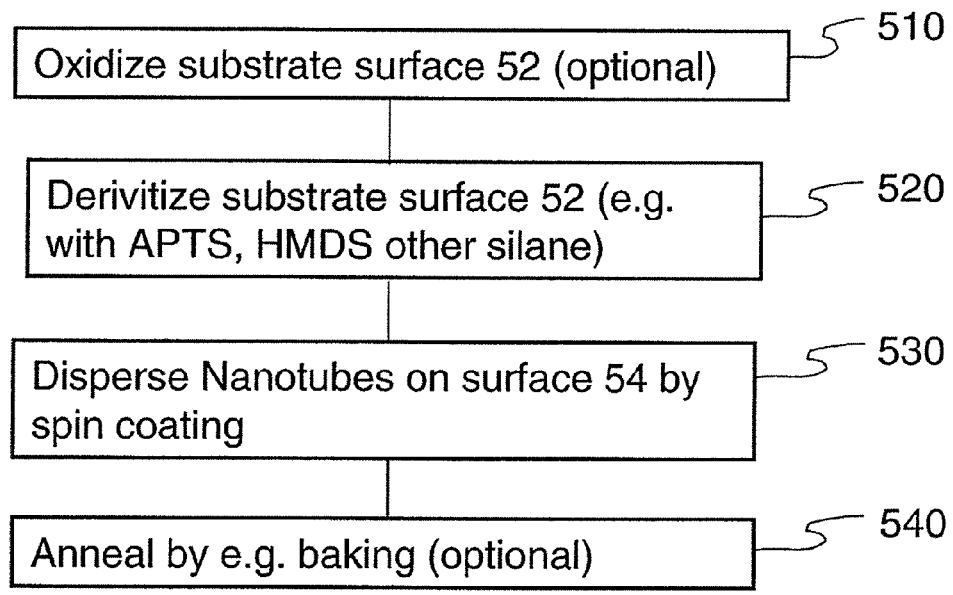
FIG. 5B illustrates an exemplary method of forming nanotube fabric by spin-coating preformed nanotubes in suspension.

FIG. 5B shows a way of making a fabric of nanotubes on a functionalized carbon nanotube growth substrate surface 52. The substrate surface 52 may be prepared for spin coating by functionalizing the surface. Specifically, functionalization of a wafer/substrate surface involves derivatizing the surface of the substrate. For example, one could chemically convert a hydrophilic to hydrophobic state or provide functional groups such as amines, carboxylic acids, thiols or sulphonates to alter the surface characteristics of the substrate. Functionalization may include the optional primary step 510 of oxidizing or ashing the substrate in oxygen plasma to remove carbon and other impurities from the substrate surface and to provide a uniformly reactive, oxidized surface which is then reacted with a silane. One such polymer that may be used is 3-aminopropyltriethoxysilane (APTS). The substrate surface 52 may be derivitized 520 prior to application of a nanotube suspension to enhance bonding of the nanotubes. The inventors foresee that any reactive silane could be used in functionalization of such a surface. In a particular, non-limiting embodiment, the substrate surface 52, whether or not subjected to ashing, is exposed to an approximately 1 to 50 millimolar solution of APTS in suitable organic solvent, e.g. hexane, but more preferably 13 to 28 millimolar APTS in hexane, such that approximately a monolayer of APTS is deposited on the substrate surface. In order to form such a monolayer of APTS, the substrate typically is immersed in an APTS solution for 30 minutes. Once the surface 52 is prepared for spin coating, carbon nanotubes are dispersed 530 on the surface, and the surface is subjected to spinning in order to disperse the nanotubes, forming a nanotube fabric (e.g., fabric 54 of FIG. 5A). The substrate is then (optionally) annealed 540.

Different methods may be employed to apply nanotubes to surfaces to form nanofabrics: to attain desired fabric properties; the selection of one method over another depends, in part, on the properties of the pre-formed nanotubes being used. For example, under certain embodiments laser-ablated SWNTs are used; under other embodiments, commercially-available high pressure carbon monoxide decomposition SWNTs nanotubes are used, such as HiPco™ nanotubes available from Rice University; under still other embodiments, other nanotubes may be used.

Under some embodiments, laser-ablated nanotubes are mixed with a solvent at a concentration of about 100-500 μg/mL. Solvents which are quite useful for suspension of SWNTs and distribution via spin coating include isopropanol, methanol, ethanol, 1,2 dichlorobenzene, 1,3 dichlorobenzene, 1,4 dichlorobenzene, chlorobenzene, n-methylpyrolidinone, dimethylformamide, dimethylsulfoxide, acetonitrile, hexane, toluene, methylene chloride and chloroform. While all of these solvents have the ability to suspend nanotubes, the precise characteristics of the film desired and substrate used are important for solvent selection. If a low boiling solvent is desired hexane would, for example, be a better selection than DMSO. 1,2 dichlorobenzene is a preferred solvent owing to its excellent suspension properties and compatibility with industrial semiconductor processes.

Under some embodiments, HiPco™ nanotubes may be used. The HiPco™ nanotubes are SWNTs and relatively free from amorphous deposits, fibrous deposits and other impurities. HiPco™ tubes are mixed into orthodichlorobenzene at a more dilute concentration than are laser ablated nanotubes, typically 10-200 μg/mL.

Under the above embodiments, the preferred concentration depends on the length of the nanotubes used. Laser ablated nanotubes tend to have overall greater lengths than HiPco™ tubes. Regardless of the nanotubes used, the nanotubes in mixture should be adequately dispersed, e.g., by sonication.

Adequately-dispersed nanotubes may be applied 530 onto a substrate surface by spin coating. Such a surface should be relatively free of any residue remaining after storage or after any substrate preparation step, e.g. functionalization of the surface. If solvent, e.g. hexane is present on the substrate's surface, it may be removed, e.g., by baking at 100-115° C. for 1 minute. After removal of any storage solvent, the nanotubes are spun onto the substrate surface.

One way of spin coating the nanotubes involves spinning the substrate, for example, at 1000 rpm while depositing the nanotube solution on the substrate surface, for about 30 seconds or alternatively they can be applied before the spinning has begun. The substrate may (i.e., optionally) then be dried, for example, by spinning at 4000 rpm until dry. Further coats of nanotube suspension may be applied in like manner, until the substrate surface is coated with the desired density of nanotubes. Ribbon density may be varied based on desired use. Adequate layers of nanotubes typically have resistance per square measurements between 1-1000 k$\Omega$/□. For particular applications, nanotube layers with resistances per square below 1 k$\Omega$/□ may be preferred, and for yet other uses, nanotube films with resistance per square measurements of 1-10 M$\Omega$/□ may be sufficient. Typically four coatings of the nanotube suspension are applied to the substrate surface to create a fabric that will have a redundancy of electrically conductive pathways. After a layer of nanotubes of desired density, i.e., a monolayer, is spun onto the substrate, the substrate may be baked 540 once again to remove any remaining solvent, e.g., at 100-115° C. After four coatings are applied as described, a fabric resistance per square of 100 k$\Omega$ is typically measured. The actual resistance per square depends upon the quality of the nanotubes used, their compositions, and overall purity.

Spin Coating Nanotubes on Non-Functionalized Substrate Surfaces

A non-functionalized substrate surface may be coated with nanotubes by spin coating. The surface may be oxidized, e.g., by ashing in oxygen plasma, to remove surface impurities, or it may be coated and not oxidized. The nanotubes used may be, but are not limited to, laser-ablated SWNTs or HiPco™ nanotubes.

Adequately dispersed nanotubes may be deposited on a non-functionalized substrate surface by spin coating. Similarly to the above, the substrate may be spun at 1000 rpm for 30 seconds while applying a nanotube solution to the substrate surface to distribute the nanotubes or the solution may be applied first and then spun. Further coats of nanotube suspension may be applied until the substrate surface is coated with the desired density of nanotubes. The substrate may be dried (optionally) between application steps, e.g., by spinning at 4000 rpm until dry.

Similarly to the above, ribbon density may be varied based on desired use. Typically, eight coatings of the nanotube suspension are applied to the non-functionalized substrate surface, when using the preceding parameters, to attain a fabric of electrically conductive nanotubes. After a layer of nanotubes of desired density is spun onto the substrate surface, the substrate can be baked once again to remove any remaining solvent, e.g. at 100-115° C. Such a method typically results in a nanotube layer resistance per square measurement of 1-100 k$\Omega$ which is dependent both on the number of applications performed and the purity and character of the nanotubes used. Because nanotubes that have been deposited on a surface may be solvated and removed by subsequent applications of nanotubes in solvent, it may be desirable to cure the substrate and nanotubes before subsequent applications of solvated nanotubes. Such curing may be accomplished through evaporation or drying. Another way of limiting the subsequent dissolution and removal of already-spun-on tubes (removal by dissolution and from the centrifugal force overcoming van der Waals attraction between the nanotubes and the substrate surface) is to use a different solvent for subsequent spin coating steps.

The density of the nanotube ribbon may be controlled by altering such variables as including but not limited to functionalization of the underlying surface, spin coating parameters (length of time and RPM), solvent choice, nanotube type and concentration, diameter and length of nanotubes, number of applications and substrate type and composition.

Provided below are several exemplary ways of forming nanofabrics using the above principles.

Example 28

A wafer substrate is first ashed in oxygen plasma for 15 minutes. After ashing, the substrate is bathed for 30 minutes in a solution of 3-aminopropyltriethoxysilane (APTS), the functionalization agent, and hexane at a ratio of 30-60 µL of APTS to 10 mL of Hexane. During the surface functionalization step, a nanotube solution is prepared. HiPco™ SWNTs are mixed in a solution comprising 1 mg of nanotubes and 50 ml 1,2 dichlorobenzene. The nanotube solution is then sonicated for 1 hour to adequately disperse the nanotubes in the solvent solution. Before nanotube deposition, the substrate is removed from the hexane bath and is baked at 100-115° C. for 1 minute to remove any solvent residue. After baking, the nanotubes are spun onto the wafer at 1000 rpm for 30 seconds to distribute the nanotubes, and then they are spun at 4000 rpm to dry the wafer. Four such SWNT spin coatings are applied to the wafer. After spinning, the wafer is baked again at 100-115° C. to remove any remaining solvent.

Figure 5C:
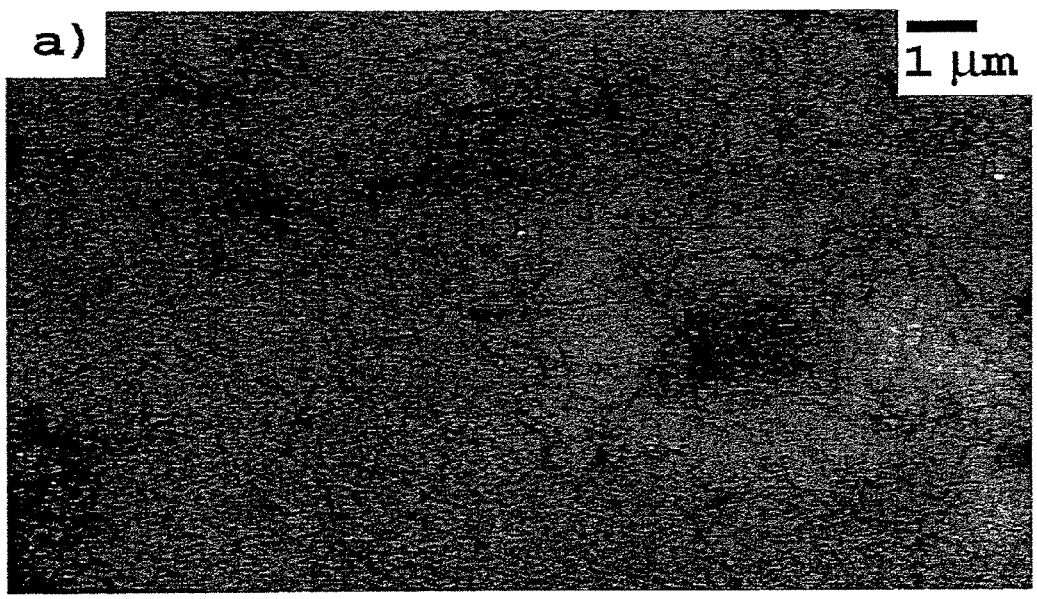
FIGS. 5C-5H are micrographs of nanofabrics formed with exemplary processes according to certain embodiments of the invention.
Figure 5D:
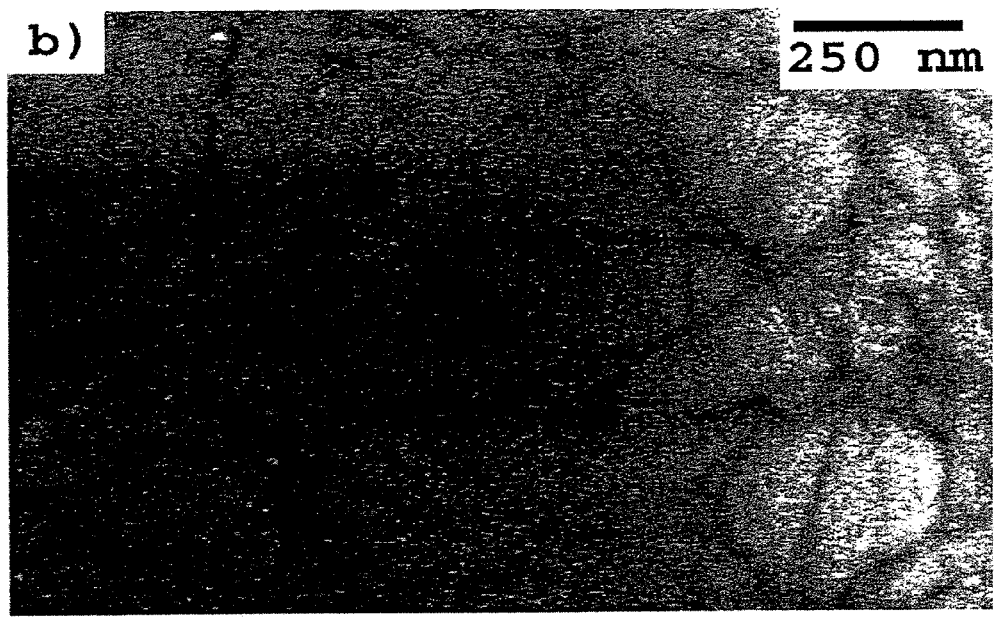

A resistance per square measurement of 1-100 kΩ was measured. FIGS. 5C-D display FESEM images of different magnifications of HiPco™ SWNTs spun onto a functionalized surface.

Example 29

Figure 5E:
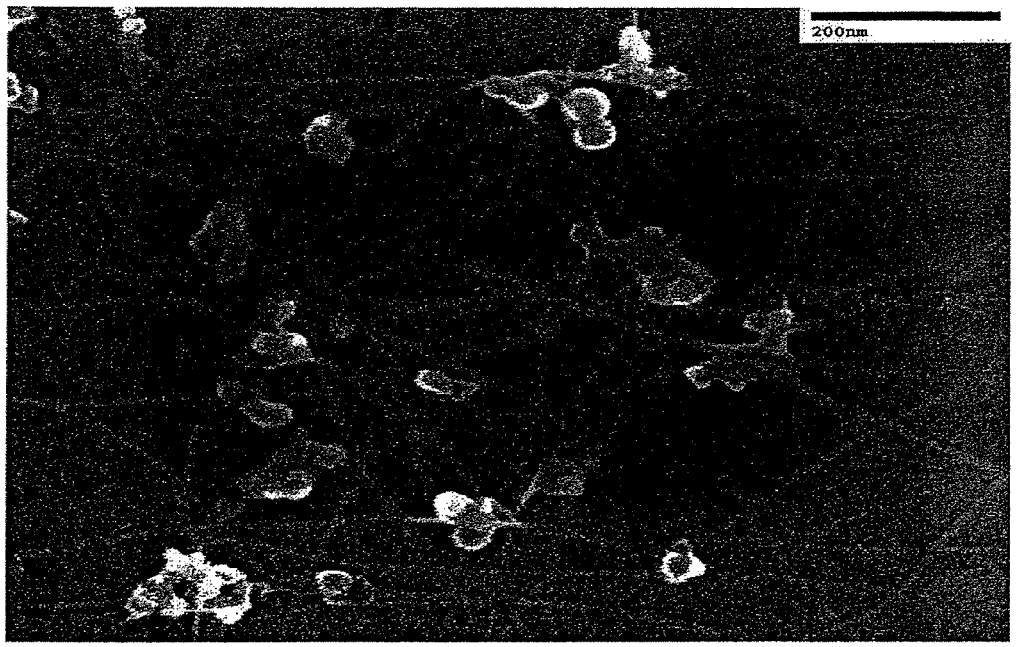

All parameters are kept the same as in example 28 except 10 mg of laser-ablated nanotubes are mixed in 100 mL of 1,2 dichlorobenzene and are spun onto a wafer surface. A resistance per square of 100-400 kΩ was measured. FIG. 5E displays a FESEM image of spun-on laser-ablated SWNTs with a functionalized surface. Some particles containing amorphous carbon impurities are observed also.

Example 30

Figure 5G:
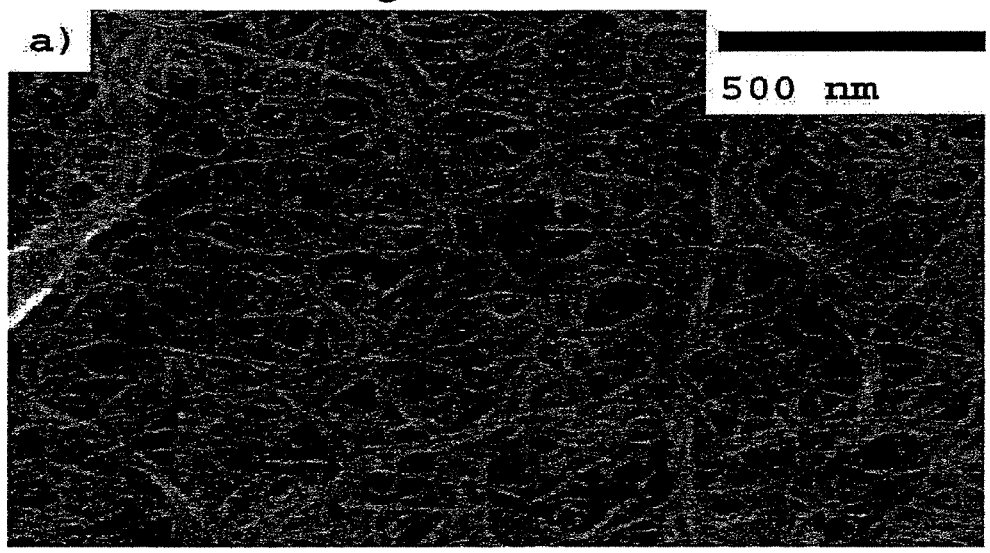
Figure 5F:
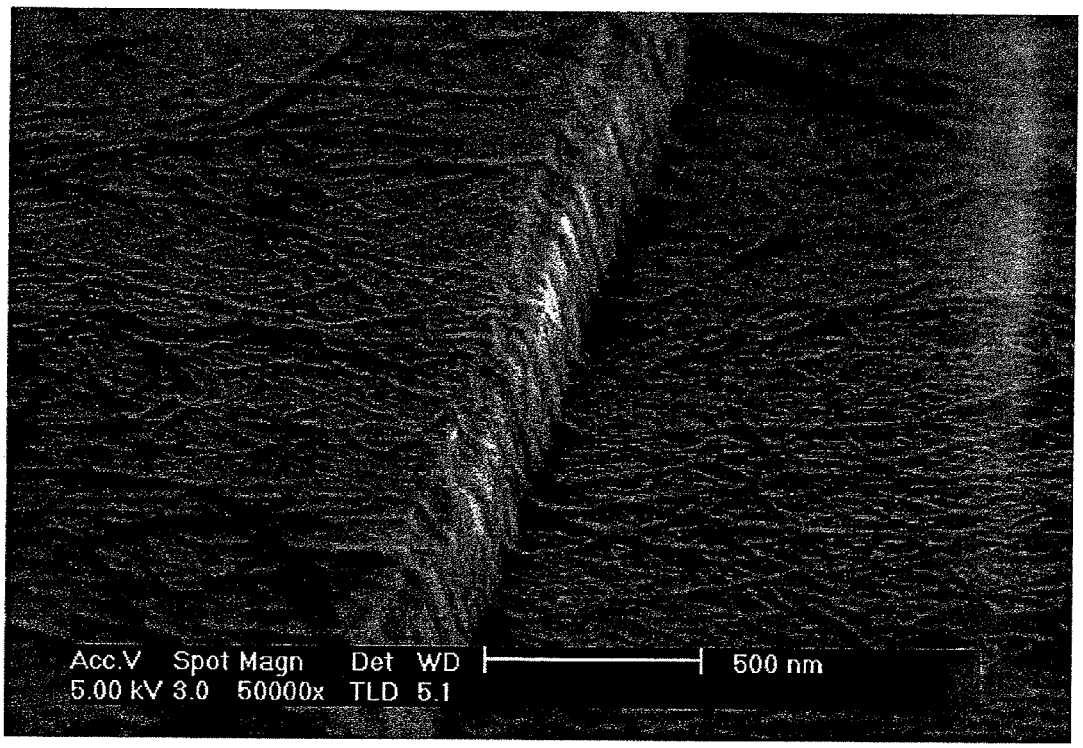

All parameters are kept constant as in example 29, except the substrate used for spin coating was stepped, i.e., not horizontally planar. FIG. 5F displays a micrograph of a nanofabric spun on to the substrate according to this method; the micrograph shows that nanotubes conform to a substrate surface via van der Waals attraction. The inventors contemplate that conformal nanofabrics may be useful in fabrication of non-horizontal electromechanical switches, especially vertical electromechanical switches or also as interconnects, actuators, relays, sensors and other electronic elements.

Example 31

Figure 5H:
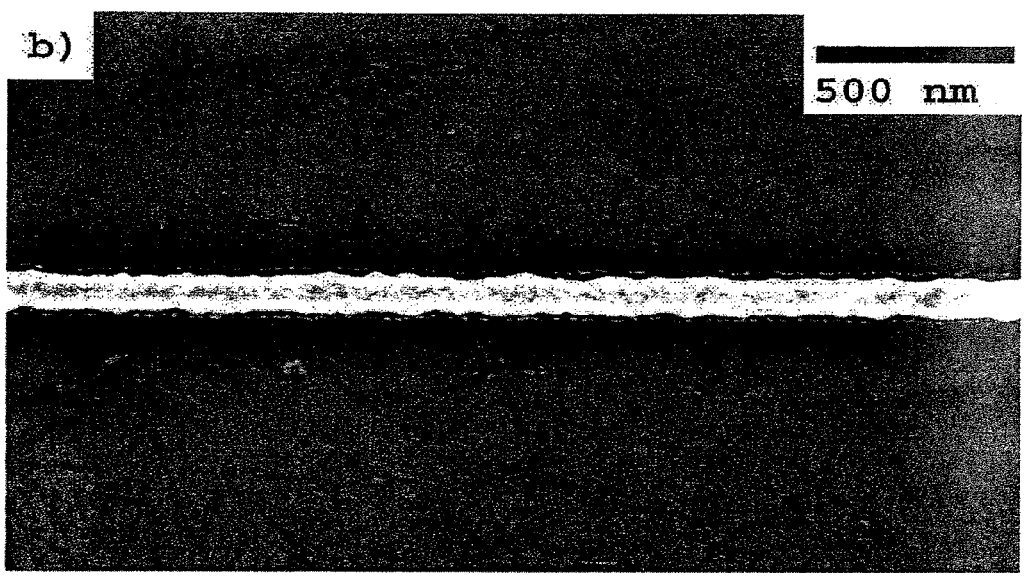

Carbon nanotubes are deposited on a non-functionalized surface as follows. A wafer surface is ashed for 1 minute. A nanotube solution is deposited and spun on to the wafer as presented in Example 28, above. Eight applications of nanotube mixture are applied to the wafer surface, producing resistance per square measurements on varying sections of the nanotube fabric ranging from 50 to 100 kΩ. FIG. 5G displays an FESEM image of SWNTs spun onto a non-functionalized wafer surface with sufficient applications to generate a multilayer nanofabric. FIG. 5H displays an FESEM micrograph of a monolayer fabric spun onto a substrate which has a prefabricated metal electrode with a width of about 130 nm shown.

Preferred embodiments operate with a range of concentrations for pre-formed nanotubes. For example for laser ablated nanotubes a concentration of about 0.1-0.5 mg/mL (100-500 ug/mL) is used. The concentration is preferably adjusted depending upon the purity and length of the nanotubes; for example, shorter nanotubes have one spinning regime and longer ones have a different regime.

In addition, preferred embodiments preferably subject the nanotube solution to sonication. For example, preferred embodiments use sonication times such as 30-120 minutes.

Patterning Nanofabrics

The new and improved methods for creating nanofabrics may be used to create articles therefrom. The U.S. patent applications, identified and incorporated above, describe specific (but not limiting) uses of such fabrics and articles. For example, the various masking and patterning techniques for selectively removing portions of the fabric are described in these applications but are not repeated here for the sake of brevity. Moreover, various component architectures are described in the incorporated applications but not repeated here for the sake of brevity.

Figure 6:
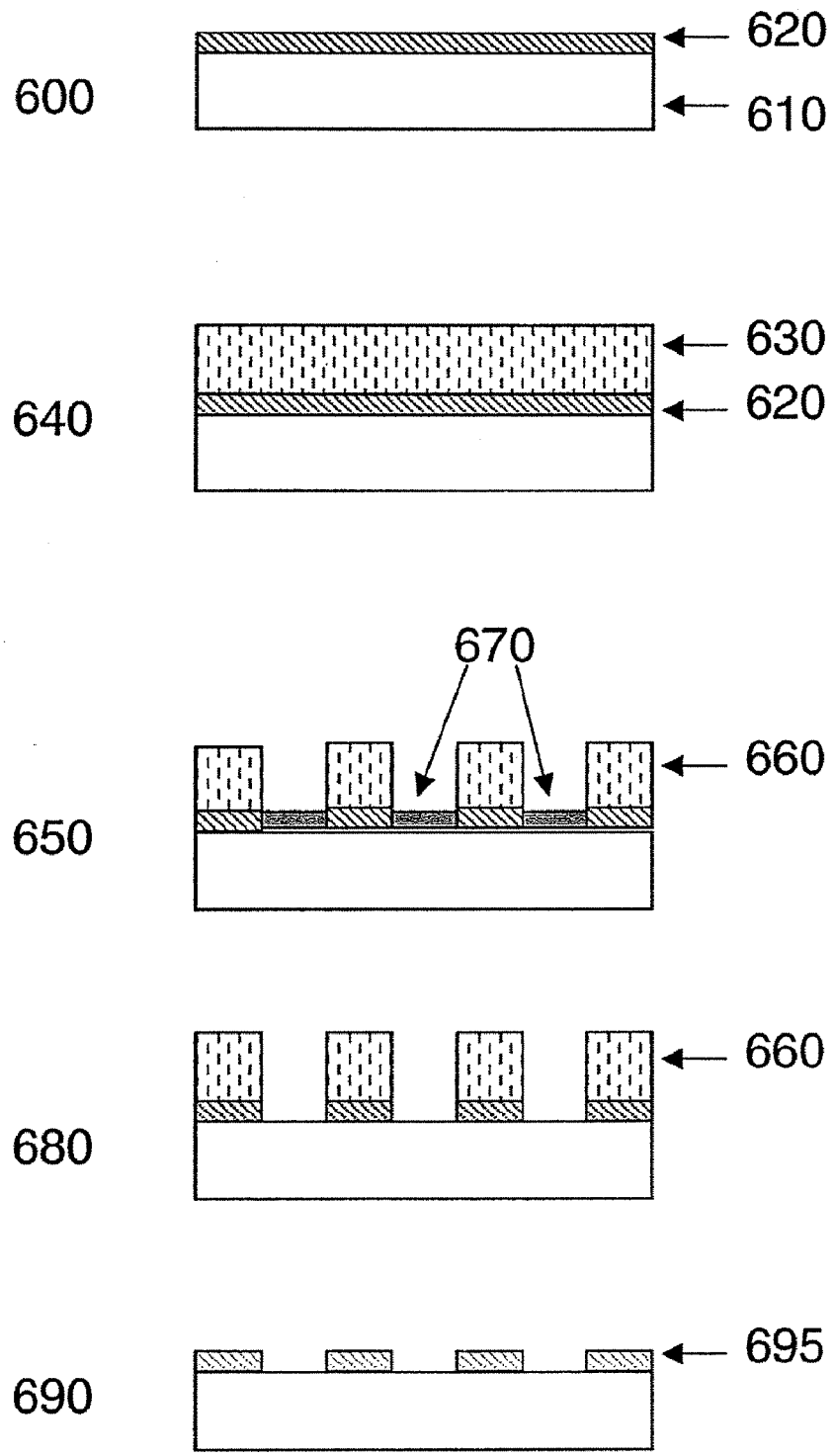
FIG. 6 are cross-sectional views of exemplary structures according to certain embodiments of the invention.

FIG. 6, for example, is a cross-sectional view of exemplary structures used in creating patterned nanofabrics. This method creates patches of carbon nanotube fabric which can be used as electronic elements. Such a patch of nanotube fabric may be used as an electromechanical switch, or as an electronic interconnect. An intermediate structure 600 is provided. Structure 600 comprises a nanofabric 620 overlying a substrate 610. The substrate 610 could be a simple substrate made of a single material; it could be a substrate which has already undergone some processing, e.g., to include vias, plugs or other elements, etc. The nanofabric 620 may be grown or formed using any of the methods disclosed or incorporated above. The nanofabric may be of SWNTs or multi-walled nanotubes. A layer of resist 630 is applied over the nanofabric 620 to form intermediate structure 640. The resist 630 is then patterned using any of a variety of techniques, including but not limited to those described in the incorporated references. For example, the resist may be patterned to correspond to the desired pattern of nanofabric patches, so that the resist will cover (and define) the desired patches. Removing selected portions of the resist (e.g., exposed portions) will create intermediate structure 650. The intermediate structure 650 includes exposed nanofabric portions 670 and remaining resist portions 660. The exposed nanofabric portions 670 may be removed in many ways; for example, by performing a reactive ion etch procedure, or oxidizing the substrate, by plasma ashing, air oxidation or other reaction methods to remove all nanotube fabric except for the desired patches, thereby creating intermediate structure 680. The remaining resist portions 660 may then be stripped from intermediate structure 680, yielding structure 690 which includes patterned patches 695 of nanofabric.

As explained in the incorporated references, the nanofabric 620 may be formed or grown over defined regions of sacrificial material and over defined support regions. The sacrificial material may be subsequently removed, yielding suspended articles of nanofabric. See, for example, Electromechanical Memory Array Using Nanotube Ribbons and Method for Making Same (U.S. patent application Ser. No. 09/915,093) filed Jul. 25, 2001, for an architecture which suspends ribbons of nanofabric.

Figure 7:
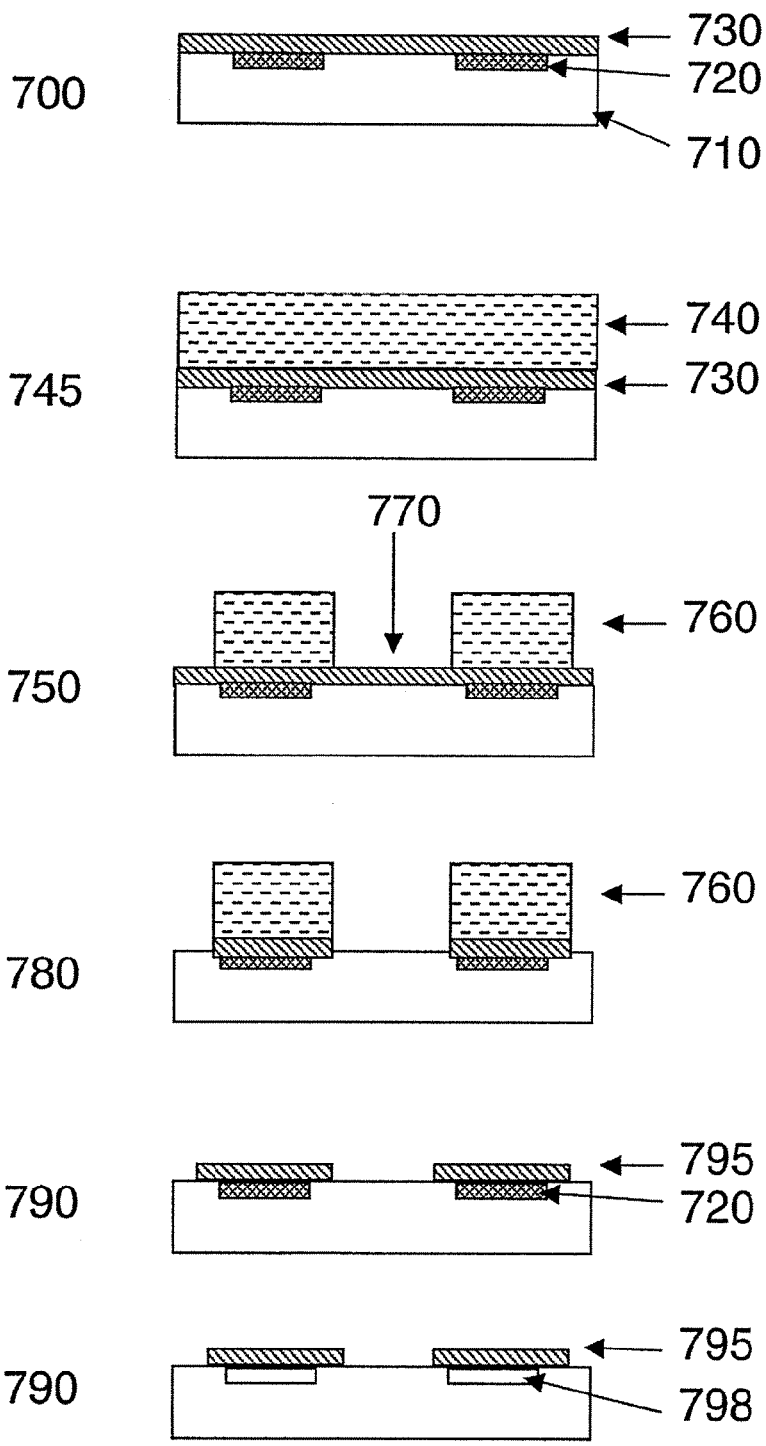
FIG. 7 shows cross-sectional views of exemplary structures according to certain embodiments of the invention.

FIG. 7, for example, is a cross-sectional view of exemplary structures used in creating suspended, patterned nanofabrics.

This method creates suspended patches of carbon nanotube fabric, which can be used as electronic elements. Such a patch of nanotube fabric may be used as an electromechanical switch, or as an actuator, a relay, a sensor, especially a biosensor or chemical sensor.

An intermediate structure 700 is provided. Structure 700 comprises defined regions of sacrificial material 720 overlying a substrate 710 (which as outlined above could made of a single material; could be a substrate which has already undergone some processing, e.g. to include vias, plugs or other elements, etc.). A nanofabric 730 covers the substrate surface and the sacrificial material 720. The nanofabric 730 may be formed or grown as outlined above and may be multilayer or single layer and may have single- or multi-walled nanotubes. A layer of resist 740 is applied over the nanofabric 730 to create intermediate structure 745. The resist 740 is then patterned (not shown). Removing selected portions of the resist (e.g., exposed portions) will create intermediate structure 750. The intermediate structure 750 includes exposed nanofabric portions 770 and remaining resist portions 760. The exposed nanofabric portions 770 may be removed in many ways; for example, by performing a reactive ion etch procedure, or oxidizing the substrate, by plasma ashing, air oxidation or other reactive methods to remove all nanotube fabric except for the desired patches, thereby creating intermediate structure 780. The remaining resist portions 760 may then be stripped from intermediate structure 780, yielding structure 790 which includes patterned nanofabric patches 795 overlying defined sacrificial material 720. The sacrificial layer 720 is removed by selective etching, leaving substantially intact the suspended patterned nanofabric 795 and leaving an air gap 798 in the place of the removed sacrificial layer. The inventors contemplate that the stripping of the remaining resist portions 760 and removal of sacrificial material 720 may be done in the same step, with an appropriate process.

Figure 8A:
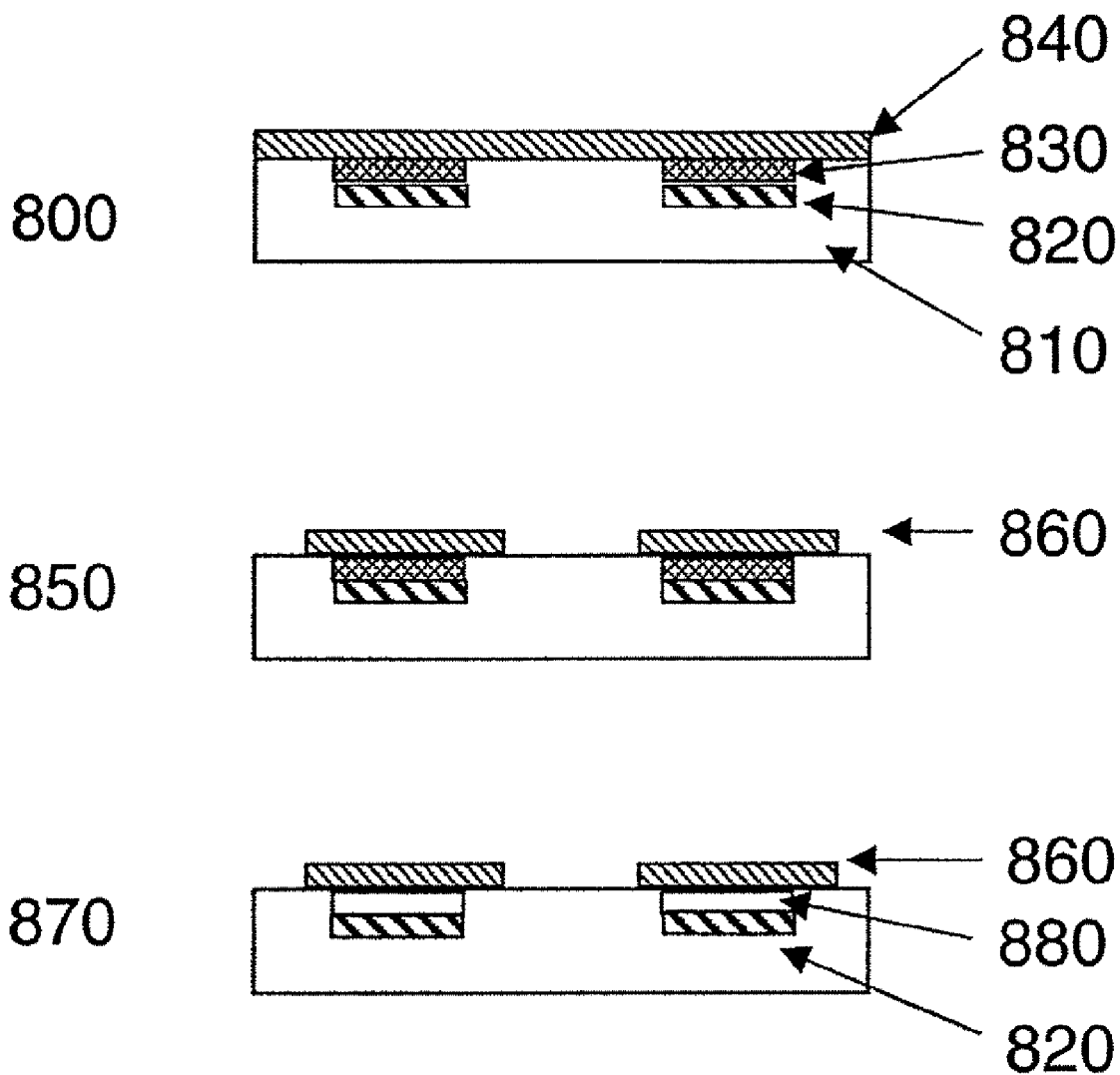
FIG. 8A shows cross-sectional views of exemplary structures according to certain embodiments of the invention.

FIG. 8A, for example, is a cross-sectional view of exemplary structures used in creating suspended, patterned nanofabrics. This method creates suspended patches of carbon nanotube fabric overlying an electrode with which the nanofabric may come into electrically conductive contact when the nanofabric is deflected. Such a device can be used as an electronic element, e.g. as an electromechanical switch, etc.

An intermediate structure 800 is provided. Structure 800 comprises a substrate 810 (similar to those described above) with already defined electrodes 820 (e.g., made of sufficiently conductive material, such as doped semiconductor or metal) and defined sacrificial material 830 thereover. A nanofabric 840 covers the substrate surface and the sacrificial layer 830. The nanofabric may be made by any of the above-described methods. Similar to that described above and as described in the incorporated references, the nanofabric 840 may be patterned (e.g., lithographic patterning) and defined portions of nanofabric may be removed to form intermediate structure 850. Patterned nanofabric articles 860 then cover defined sacrificial material 830 which in turn cover electrodes 820. The sacrificial material 830 may then be removed by selective etching, leaving remaining structures substantially intact, yielding structure 870. Structure 870 comprises suspended nanofabric articles 860 separated from electrodes 820. The nanofabric articles 860 and/or the electrodes may then be subjected to electrical stimulus to cause the nanofabric articles 860 to deflect toward, or away from, electrodes 820. As described in the incorporated references, the deflected articles retain their deflected state in a non-volatile manner.

Example 32

Figure 8B:
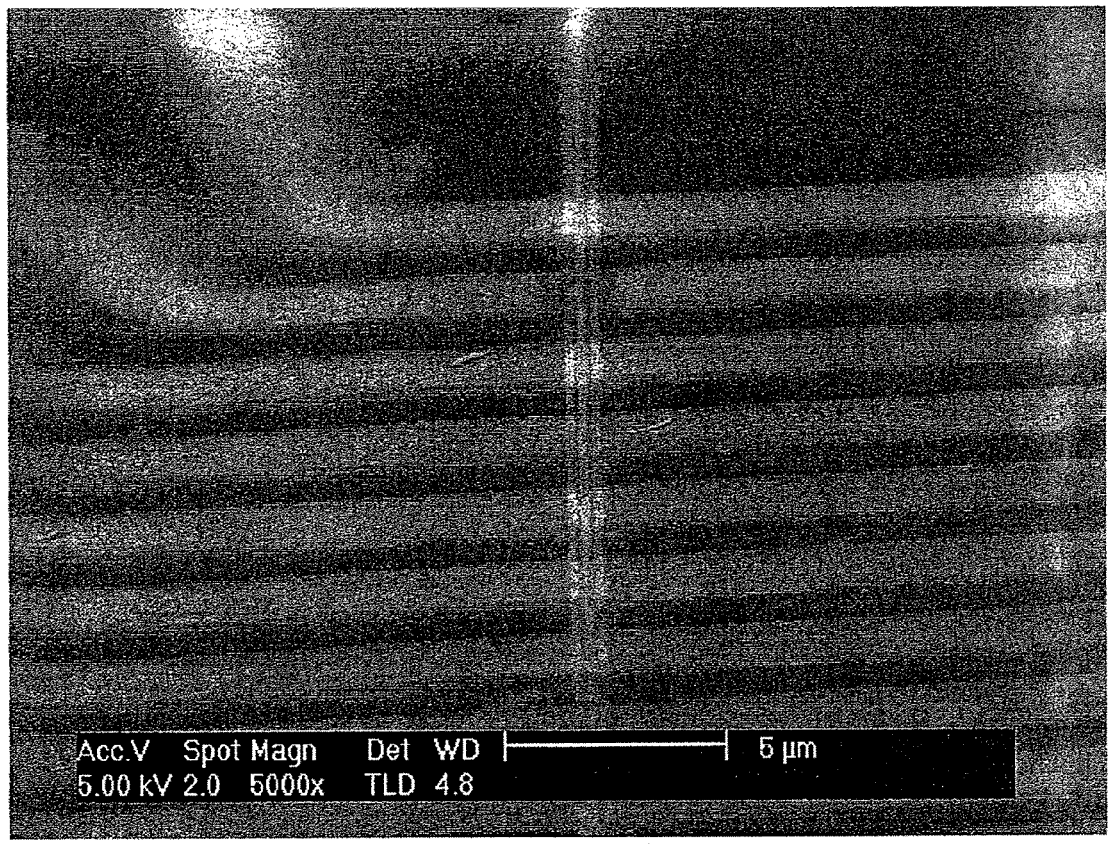
FIGS. 8B-D are micrographs of nanofabrics patterned according to certain embodiments of the invention.
Figure 8C:
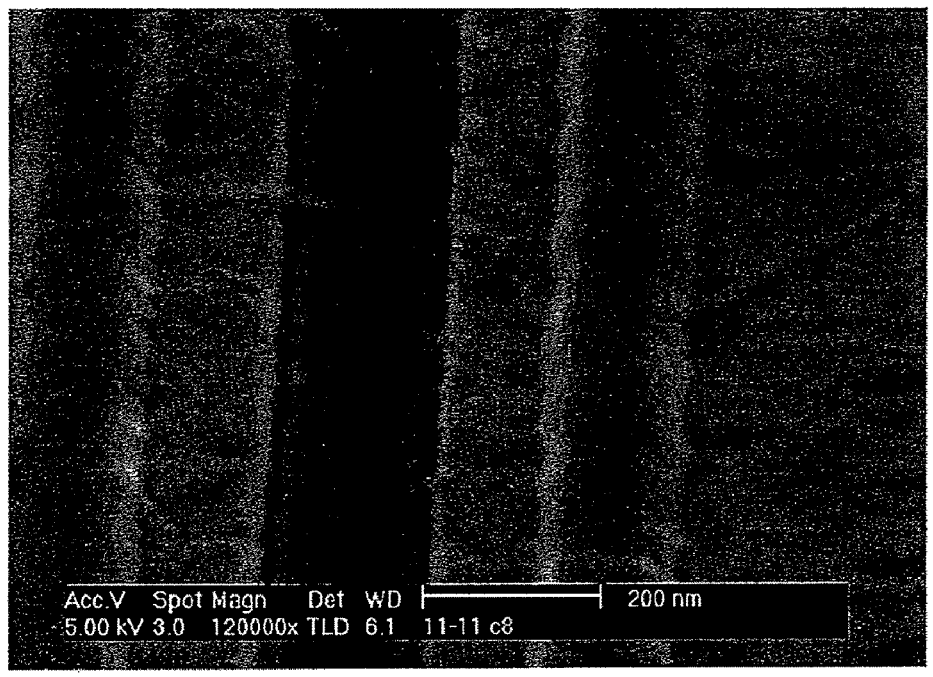
Figure 8D:
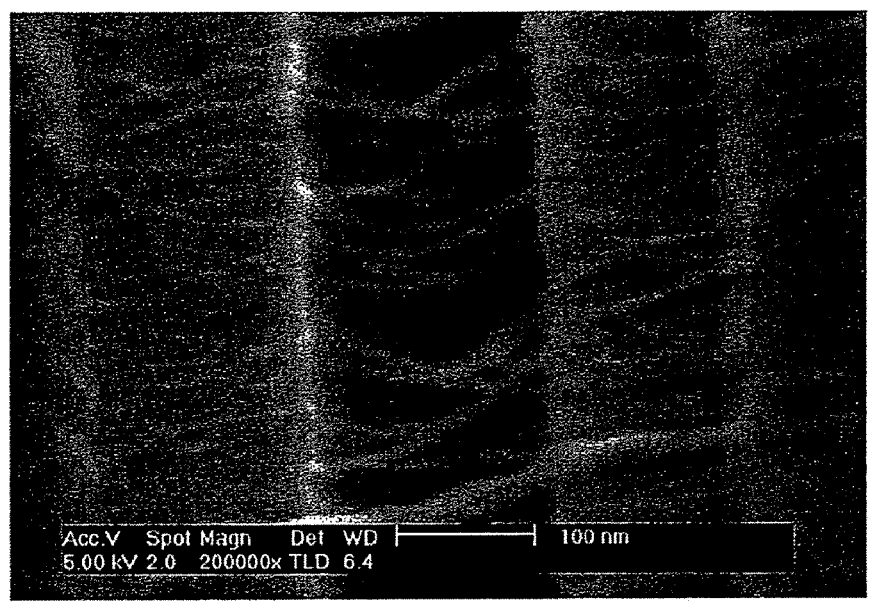

A wafer substrate, an overlying nanofabric, an embedded titanium electrode under a sacrificial layer of $Al_2O_3$ are provided. Shipley 1805 photoresist is applied to the wafer surface by spin coating at 4000 rpm for 60 seconds. The photoresist is exposed using a Kasper Mask Aligner for 8 seconds. The pattern is developed using a basic developer, thereby exposing portions of nanofabric and leaving other portions protected by the photoresist. The substrate is rinsed in deionized water and dried at 115° C. The exposed portions of nanofabric are removed by plasma ashing for five minutes with 25 cubic feet per minute oxygen at a pressure of 280 millitorr and a power of 300 Watts. The substrate is soaked in n-methylpyrolidinone at 70° C. to remove remaining photoresist for 30 minutes. The substrate is rinsed in isopropanol and dried. Hot phosphoric acid is applied to remove the $Al_2O_3$, leaving a patterned nanofabric suspended over an electrode with which it may come into electrical contact when deflected. FIG. 8B displays an FESEM image of patterned nanofabrics made by this method. In the micrograph, bare substrate regions are dark, nanofabric patches are light in color and the longitudinal light stripe is a metallic electrode. Typical resistivity for a patterned trace with a length of 100 µm and width of 3 µm is 1-10 MΩ. FIG. 8C displays an FESM image of the same structure as in 8B under greater magnification. The dark longitudinal stripe is the sacrificial layer overlying the metal electrode. FIG. 8D displays an FESM image of the same structure with the sacrificial layer removed; the nanofabric can be seen suspended over and not in contact with the electrode.

Controlled Composition of Types of Nanotubes in Nanofabric

Other embodiments involve controlled composition of carbon nanotube fabrics. Specifically, methods may be employed to control the relative amount of metallic and semiconducting nanotubes in the nanofabric. In this fashion, the nanofabric may be made to have a higher or lower percentage of metallic nanotubes relative to semiconducting nanotubes. Correspondingly, other properties of the nanofabric (e.g., resistance) will change. The control may be accomplished by direct growth, removal of undesired species, or application of purified nanotubes.

With regard to controlled direct growth, methods are known, for example, to selectively grow semiconducting nanotubes. (See Kim et al., Synthesis of Ultralong and High Percentage of Semiconducting Single-Walled Carbon Nanotubes, Vol. 2 Nanoletters 703 (2002).) The inventors envision a protocol in which selective growth of fabrics of semiconducting or metallic nanotubes followed by etching would produce nanotube ribbons or traces useful in fabrication of electromechanical devices.

With regard to removal of undesired species, methods are known, for example, to process MWNTs and SWNT ropes to convert such into metallic or semidconducting nanotubes as desired. (See Collins et al., Engineering Carbon Nanotubes and Nanotube Circuits Using Electrical Breakdown, Vol. 292 Science 706 (2001).)

With regard to application of purified nanotubes, using proper bulk nanotube preparations which contain primarily metallic or semiconducting nanotubes would allow application of a nanotube fabric to a substrate. The application could be performed via spin coating of a nanotube stock solution onto a substrate, dipping a substrate into a nanotube stock solution, spraying of nanotube stock solutions onto a surface or other methods. Application of single-walled, multiwalled or mixtures of such nanotubes can be envisioned with subsequent patterning and etching to generate fabrics or traces of sufficient length and width to make electronic devices.

By way of example, FIG. 1B.2 is similar to FIG. 1B.1 and the description thereof is not repeated. In material part, the method of FIG. 1B.2 removes the optional step of annealing nanotubes found in FIG. 1B.1 and substitutes it with a selective removal of nanotubes, e.g., removing semiconducting nanotubes or metallic. By doing so the composition of the nanofabric may be controlled.

Figure 3G:
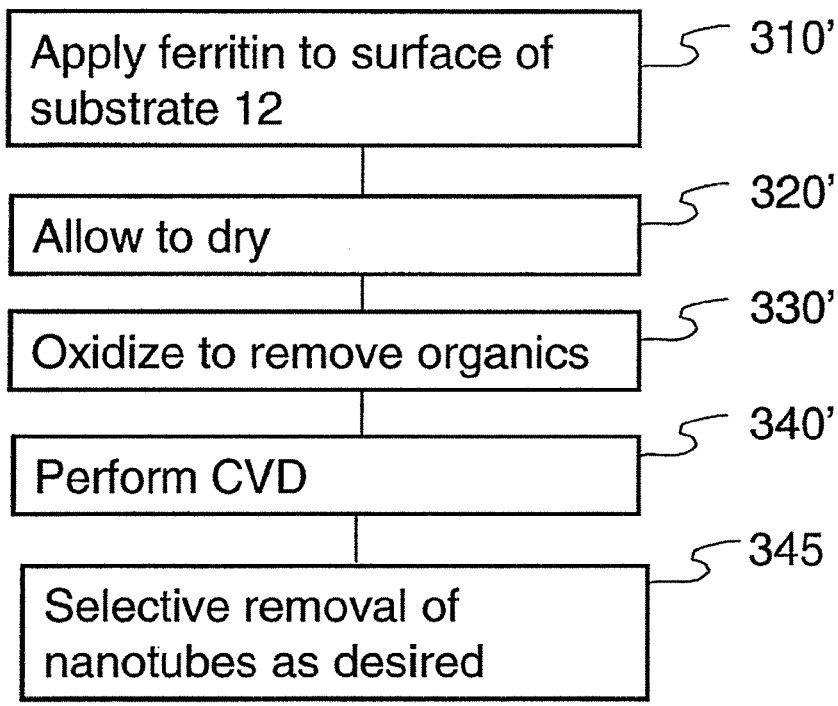
FIG. 3G-H illustrate exemplary methods of growing nanotube fabric by CVD using the structure of FIG. 3A.
Figure 3H:
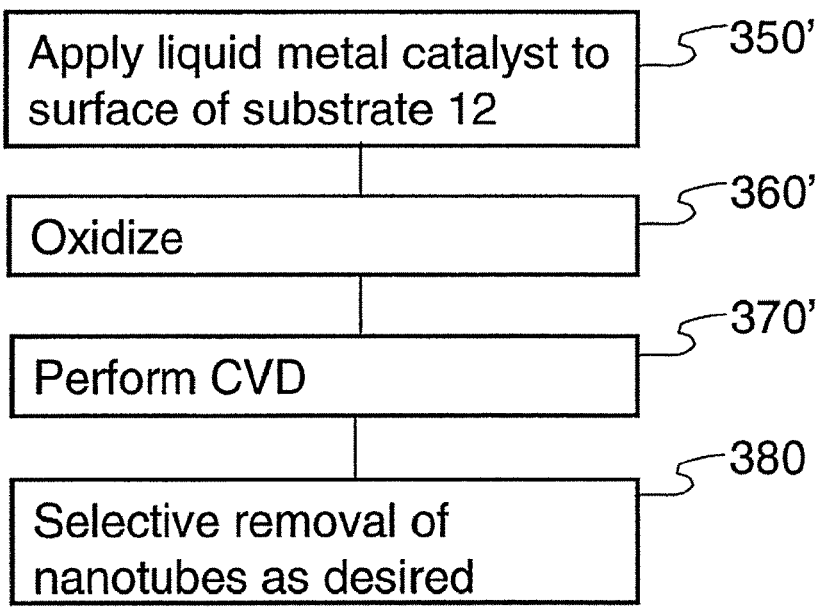

FIGS. 3G-H is similar to FIGS. 3B-C and the descriptions thereof are not repeated. In material part, the method of FIG. 3G adds a selective removal 345 of nanotubes, e.g., removing semiconducting nanotubes or metallic; analogously, the method of FIG. 3H adds a selective removal 380 of nanotubes. By doing so the composition of the nanofabric may be controlled.

Figure 4C:
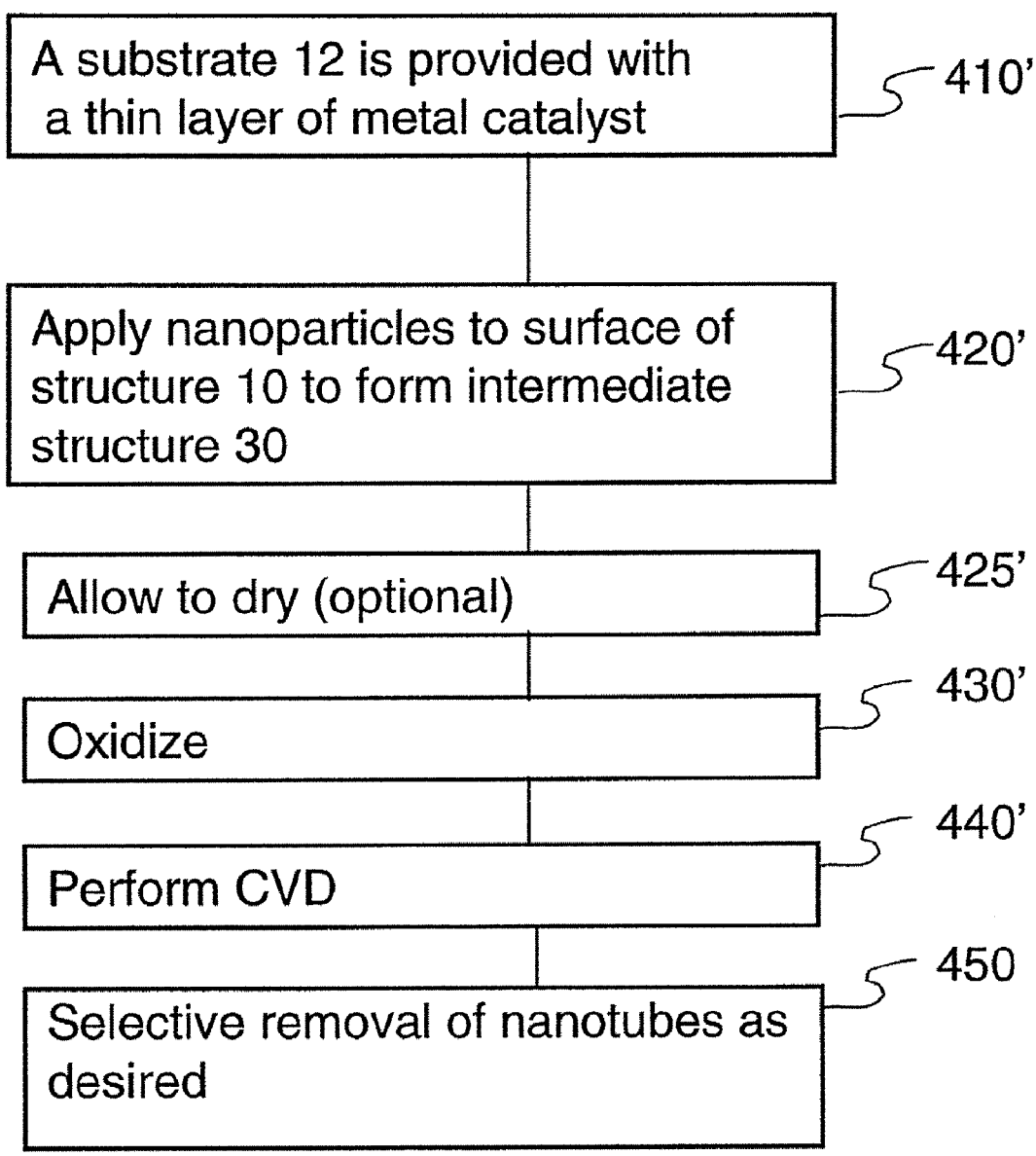

FIG. 4C is similar to FIG. 4B and the description thereof is not repeated. In material part, the method of FIG. 4C adds a selective removal 450 of nanotubes, e.g., removing semiconducting nanotubes or metallic. By doing so the composition of the nanofabric may be controlled.

FIG. 4D is similar to FIG. 4B and the description thereof is not repeated. In material part, the method of FIG. 4D substitutes the CVD step 440 of FIG. 4B with a selective growth 440' of nanotubes, in which the growth process affects the relative concentration of one type of nanotube as compared to another. By doing so the composition of the nanofabric may be controlled.

Under some of the above embodiments, the application of nanotubes may be iterative. Thus for example a nanofabric may be created and subsequently processed to remove semiconducting nanotubes and then another application of nanotubes may be applied. Repeated application and removal will increase the relative amount of metallic or semiconducting nanotubes in the resulting nanofabric.

FIG. 5I is similar to FIG. 5B and the description thereof is not repeated. In material part, the method of FIG. 5I removes the optional annealing step 540 of FIG. 5B and adds a selective removal 550 of nanotubes, e.g., removing semiconducting nanotubes or metallic. By doing so the composition of the nanofabric may be controlled. This process step 550 can be iterated to generate a more dense nanofabric.

Figure 5J:
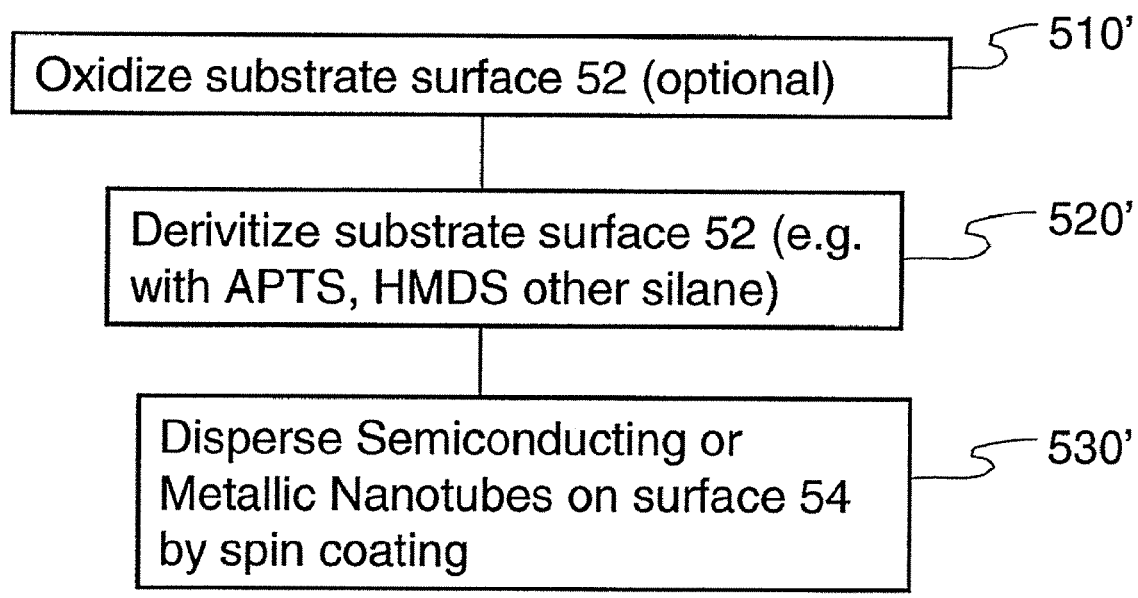

FIG. 5J is similar to FIG. 5B and the description thereof is not repeated. In material part, the method of FIG. 5I removes the optional annealing step 540 of FIG. 5B and substitutes the dispersal step 530 with a new dispersal step 530', in which the nanotubes that are disperse have a controlled composition, e.g., selected amounts of metallic nanotubes. By doing so the composition of the nanofabric may be controlled. This process step 530' can be iterated to generate a more dense nanofabric.

OTHER EMBODIMENTS

Catalyst deposited on substrate surface or remaining in spun-on SWNTs may be removed by rinse/wash steps if a desired property of the ribbon included that it be free of metal/catalyst. This could be performed by successive treatments in an appropriate solvent or acid which would cause the removal of the exterior carbon shell that typically passivates the particles during nanotube growth. Other unreacted nanoparticles could be removed with just a mild solvent wash.

Some of the above methods of manufacturing such nanofabrics and patterning articles therefrom are conducive to certain environments, such as a circuit manufacturing environment. Other methods provide nanofabrics and articles therefrom that have desirable characteristics, such as an ability to adhere to hydrophobic surfaces (found in many electronic devices), even when the feature size is in the nanometer regime (<200 nm).

While the inventors typically desire a monolayer fabric of single-walled nanotubes, for certain applications it may be desirable to have multilayer fabrics to increase current density, redundancy or other mechanical or electrical characteristics. Additionally it may be desirable to use either a monolayer fabric or a multilayer fabric comprising MWNTs for certain applications or a mixture of single-walled and multi-walled nanotubes. The previous methods illustrate that control over catalyst type, catalyst distribution, surface derivitization, temperature, feedstock gas types, feedstock gas pressures and volumes, reaction time and other conditions allow growth of fabrics of single-walled, multi-walled or mixed single- and multi-walled nanotube fabrics that are at the least monolayers in nature but could be thicker as desired with measurable electrical characteristics.

In the case of formation of fabrics using pre-grown nanotubes, formulation of nanotube solutions in appropriate solvents with subsequent distribution over surfaces with or without derivitization allows exquisite control over porosity and density of the fabrics and would lead to facile generation of single-walled, multi-walled or mixed single- and multi-walled fabrics that are at the least monolayers in nature but could be thicker as desired with measurable electrical characteristics.

It will be further appreciated that the scope of the present invention is not limited to the above-described embodiments, but rather is defined by the appended claims, and that these claims will encompass modifications of and improvements to what has been described.

What is claimed is:

1. A structure for a nanotube switching device, comprising:
   a substrate having a plurality of electrical contacts defined therein, the substrate having an upper surface; and
   a non-woven nanotube fabric layer disposed over the upper surface of the substrate.

2. The structure of claim 1, further comprising a photolithographic mask disposed over the nanotube fabric layer, defining a pattern thereon, wherein the photolithographic mask comprises a layer of photoresist disposed over the nanotube fabric layer.

3. The structure of claim 2, wherein the layer of photoresist has been reacted using radiation.

4. The structure of claim 1, wherein the nanotube fabric layer includes at least one of single-walled nanotubes and multi-walled nanotubes.

5. The structure of claim 1, wherein the nanotube fabric layer includes at least one of metallic nanotubes and semiconducting nanotubes.

6. The structure of claim 1, wherein the substrate includes at least one of a via and a plug.

7. The structure of claim 1, wherein the substrate comprises defined regions of sacrificial material and defined support regions.

8. The structure of claim 7, wherein the defined regions of sacrificial material form at least a portion of the upper surface of the substrate.

9. The structure of claim 8, wherein the plurality of electrical contacts form at least a portion of the upper surface of the substrate and wherein regions of sacrificial material define a spacing between regions of the nanotube fabric layer and the electrical contacts.

10. The structure of claim 9, wherein the nanotube fabric layer is partially suspended.

11. The structure of claim 1, wherein the nanotube fabric layer comprises substantially a monolayer of nanotubes.

12. The structure of claim 1, wherein the nanotube fabric layer comprises a multilayer of nanotubes.

13. The structure of claim 1, wherein the nanotube fabric layer has a resistance of less than 1 kΩ/square.

14. The structure of claim 1, wherein the nanotube fabric layer has a resistance of between 1-1000 kΩ/square.

15. The structure of claim 1, wherein the nanotube fabric layer has a resistance of between 1-10 MΩ/square.

16. The structure of claim 1, wherein the nanotube fabric layer comprises carbon nanotubes.

17. A structure for a nanotube switching device, comprising:
- a substrate having a plurality of electrical contacts defined below an upper surface of the substrate; and
- a patterned region of a non-woven nanotube fabric layer disposed above the upper surface of the substrate and electrically communicable with the plurality of electrical contacts.

18. The structure of claim 17, wherein the patterned region of the non-woven nanotube fabric layer is at least partially suspended.

19. The structure of claim 17, further comprising a photolithographic mask disposed over and substantially aligned with the patterned region of the non-woven nanotube fabric layer.

20. The structure of claim 17, wherein the patterned region of the non-woven nanotube fabric layer comprises substantially a monolayer of nanotubes.

21. The structure of claim 17, wherein the patterned region of the non-woven nanotube fabric layer comprises a multilayer of nanotubes.

22. The structure of claim 17, wherein the non-woven nanotube fabric layer comprises carbon nanotubes.

\* \* \* \* \*